United States Patent
Suess et al.

(10) Patent No.: US 11,770,633 B2
(45) Date of Patent: Sep. 26, 2023

(54) READOUT ARCHITECTURE FOR INDIRECT TIME-OF-FLIGHT SENSING

(71) Applicant: OMNIVISION TECHNOLOGIES, INC., Santa Clara, CA (US)

(72) Inventors: Andreas Suess, San Jose, CA (US); Zheng Yang, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 23 days.

(21) Appl. No.: 17/513,064

(22) Filed: Oct. 28, 2021

(65) Prior Publication Data

US 2023/0137801 A1 May 4, 2023

(51) Int. Cl.
*H04N 25/75* (2023.01)
*H01L 27/148* (2006.01)
*H01L 27/146* (2006.01)
*H04N 25/71* (2023.01)
*G01S 17/894* (2020.01)

(52) U.S. Cl.
CPC ........... *H04N 25/75* (2023.01); *G01S 17/894* (2020.01); *H01L 27/14612* (2013.01); *H01L 27/14831* (2013.01); *H04N 25/745* (2023.01)

(58) Field of Classification Search
CPC .... H04N 25/75; H04N 25/745; G01S 17/894; H01L 27/14612; H01L 27/14831
See application file for complete search history.

(56) References Cited

U.S. PATENT DOCUMENTS

| 10,110,837 | B2 | 10/2018 | Lin et al. | |
| 2018/0115762 | A1* | 4/2018 | Bulteel | G01S 3/00 |
| 2019/0339392 | A1* | 11/2019 | Manabe | H01L 27/1463 |
| 2020/0018834 | A1* | 1/2020 | Boutaud | G01S 7/4808 |
| 2020/0264311 | A1* | 8/2020 | Le Dortz | G01S 7/4913 |
| 2021/0199781 | A1* | 7/2021 | Jin | G01S 17/18 |

(Continued)

OTHER PUBLICATIONS

Sung-Woo Lee, et al., "LIDAR system using indirect time of flight method and MEMS scanner for distance measurement," [Online], 2016 International Conference on Optical Mems and Nanophotonics (OMN), We3.4-1, [retrieved Sep. 25, 2021], retrieved from IEEE Xplore, pp. 1-2.

(Continued)

*Primary Examiner* — Shahbaz Nazrul
(74) *Attorney, Agent, or Firm* — Perkins Coie LLP

(57) ABSTRACT

A time-of-flight sensor includes a pixel array of pixel circuits. A first subset of the pixel circuits is illuminated by reflected modulated light from a portion of an object. A second subset of the pixel circuits is non-illuminated by the reflected modulated light. Each pixel circuit includes a floating diffusion that stores a portion of charge photogenerated in a photodiode in response to the reflected modulated light. A transfer transistor transfers the portion of charge from the photodiode to the floating diffusion in response to modulation by a phase modulation signal. A modulation driver block generates the phase modulation signal and is coupled to a light source that emits the modulated light to the portion of the object. The modulation driver block synchronizes scanning the modulated light emitted by the light source across the object with scanning of the first subset of the pixel circuits across the pixel array.

44 Claims, 9 Drawing Sheets

(56) References Cited

U.S. PATENT DOCUMENTS

2022/0026574 A1* 1/2022 Vaello Paños ........ G01S 17/894
2022/0035010 A1* 2/2022 Caporale ............... G01S 7/4865
2022/0201187 A1* 6/2022 Oh ......................... H04N 23/74

OTHER PUBLICATIONS

Seung-Han Chung, et al. "LIDAR system with electromagnetic two-axis scanning micromirror based on indirect time-of-flight method," Micro and Nano Systems Letters, Mar. 12, 2019, 7:3, <https://doi.org/10.1186/s40486-019-0082-9> [retrieved Sep. 27, 2021], pp. 1-5.
Unsal Kabuk, "4D Solid-State LIDAR," Ibeo Automotive, International SPAD Workshop, Jun. 2020, pp. 1-24 brochure.
Dr. Andre Srowig, "256×16 SPAD Array and 16-Channel Ultrashort Pulsed Laser Driver for Automotive LIDAR," Elmos, International SPAD Sensor Workshop, Sep. 2020, pp. 1-53 brochure.
MEMS.Me, "Explore the principle of iPad Pro lidar and interpret dToF sensing technology," May 12, 2020 [retrieved Oct. 5, 2021], pp. 1-9, located at http://www.mems.me/mems/optical_mems_202005/9743.html.

* cited by examiner

READOUT ARCHITECTURE FOR INDIRECT TIME-OF-FLIGHT SENSING

BACKGROUND INFORMATION

Field of the Disclosure

This disclosure relates generally to image sensors, and in particular but not exclusively, relates to time-of-flight sensors.

Background

Interest in three dimensional (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the 3D images. In addition, this technique is complex and therefore requires significant computer processing power in order to create the 3D images in real time.

For applications that require the acquisition of 3D images in real time, active depth imaging systems based on time-of-flight measurements are sometimes utilized. Time-of-flight cameras typically employ a light source that directs light at an object, a sensor that detects the light that is reflected from the object, and a processing unit that calculates the distance to the object based on the round-trip time it takes for the light to travel to and from the object.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
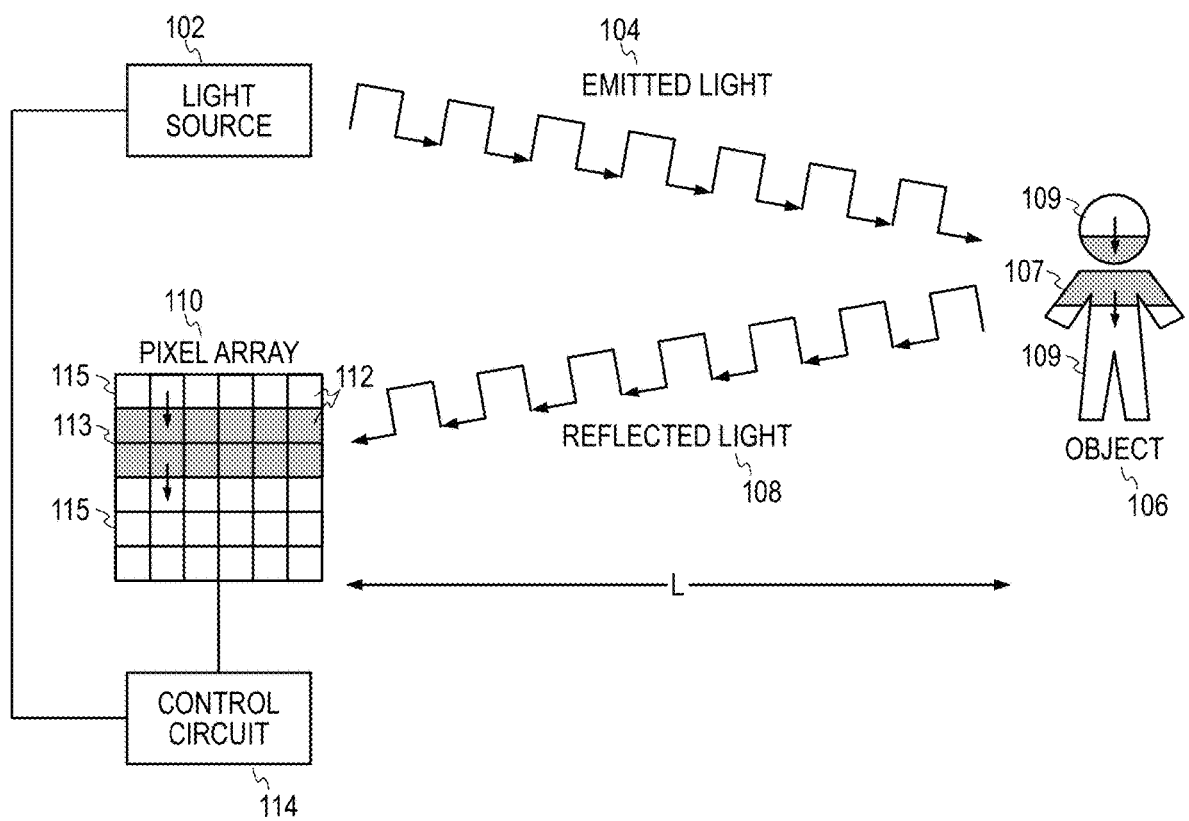
FIG. 1 is a block diagram that shows one example of a time-of-flight light sensing system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. In addition, common but well-understood elements that are useful or necessary in a commercially feasible embodiment are often not depicted in order to facilitate a less obstructed view of these various embodiments of the present invention.

DETAILED DESCRIPTION

Examples directed to various embodiments of a time-of-flight sensing system with indirect time-of-flight solutions for portions of the field-of-view are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of indirect time-of-flight sensing systems include a light source is configured to emit modulated light to an object. The modulated light is then reflected from the object back to a time-of-flight sensor that includes a time-of-flight pixel array that includes a plurality of time-of-flight pixel circuits. In the various examples, the time-of-flight sensor includes a modulation driver block that synchronizes the modulated light emitted from the light source with the time-of-flight pixel circuits included in the time-of-flight pixel array that are configured to be illuminated by the reflected modulated light from the object and read out.

In various examples, a first subset of the time-of-flight pixel circuits included in the time-of-flight pixel array are configured to be enabled, while a second subset of the time-of-flight pixel circuits included in the time-of-flight pixel array are configured to be disabled when sensing the reflected modulated light from the object. In various examples, the first subset of the time-of-flight pixel circuits included in the time-of-flight pixel array are configured be illuminated by the reflected modulated light from the object, while the second subset of the time-of-flight pixel circuits included in the time-of-flight pixel array are configured to be non-illuminated by the reflected modulated light from the object. In various examples, the first subset of the time-of-flight pixel circuits included in the time-of-flight pixel array that are configured be illuminated by the reflected modulated light from the object may be scanned across the time-of-flight pixel array until an entire frame is captured by the time-of-flight pixel array. In other examples, the first subset of the time-of-flight pixel circuits included in the time-of-flight pixel array that are configured be illuminated by the reflected modulated light from the object may be randomly addressed and accessed to monitor or track objects and adjust a region of interest in the time-of-flight pixel array.

As will be discussed, in the various examples, the first subset of the pixel circuits may include one or more line shaped regions (e.g., row(s) or column(s) in the time-of-flight pixel array), one or more spot shaped regions (e.g., randomly addressable contiguous region of pixel circuits in the time-of-flight pixel array), and/or one or more non-contiguous regions (e.g., non-neighboring clusters of pixel circuits in the time-of-flight pixel array) of the pixel array included in the time-of-flight sensor.

In operation, modulated light is reflected from a portion of the object and impinges onto the pixel circuits included in the first subset of the pixel circuits that are included in the time-of-flight pixel array. Pixel circuits that are not illuminated or non-illuminated by the reflected modulated light may be included in a second subset of the pixel circuits. The pixel circuits included in the second subset of the pixel circuits may be deactivated, which reduces readout speed requirements and helps to save power consumption and cost.

The object distance is determined in response to the measured phase of the modulation, which may be used to yield a 3D frame. As will be described in the various examples, a demodulation pixel front-end down-converts and/or mixes this waveform with a differential phase modulation signals that are applied to the transfer gates or transfer transistors of a fractional portion or subset of the indirect time-of-flight pixel circuits included in the time-of-flight pixel array for a given exposure.

In the various examples, the differential phase modulation signals have the same frequency as the modulated light to realize homodyne detection by the indirect time-of-flight sensor. Employing different phases in the differential phase modulation signals allows to reconstruction of the encoded distance. In various examples, at least 3 independent measurements (e.g., sub-frames) are employed to decode the 3 unknowns of distance/phase, reflectivity, and ambient light. Typically 4 phases are used (e.g., 0°/180° and 90°/270°).

It is noted that phases that are increments of 360° apart cannot be distinguished, which consequently results in ambiguities in the measurements. As a result, the modulation frequency of the differential phase modulation signal is chosen not to exceed a maximum modulation frequency in order to accommodate a desired depth range. However, a tradeoff is that increasing the modulation frequency improves precision. Hence, typically multiple frequencies are incorporated to resolve ambiguities and still yield good precision. At each frequency, all 3/4 phases need to be acquired.

To illustrate, FIG. 1 is a block diagram that shows one example of a time-of-flight light sensing system 100, in accordance with the teachings of the present invention. As shown in the depicted example, time-of-flight light sensing system 100 includes light source 102 that is synchronized with a time-of-flight sensor that includes a pixel array 110, which includes a plurality of pixel circuits 112, and a control circuit 114 that is coupled to the pixel array 110 and light source 102.

As shown in the example, light source 102 and pixel array 110 are positioned at a distance L from object 106. Light source 102 is configured to emit light 104 towards object 106. Reflected light 108 is directed back from object 106 to pixel array 110 as shown. It is noted that pixel array 110 and control circuit 114 are represented as separate components in FIG. 1 for explanation purposes. However, it is appreciated that pixel array 110 and components of control circuit 114 may be integrated onto a same integrated circuit chip or wafer in a non-stacked standard planar sensor.

As shown in the depicted example, the light source 102 is configured to illuminate only a portion 107 of object 106 at a time such that portion 109 of object 106 is non-illuminated by the emitted light 104 from light source 102. In the various examples, the illuminated portion 107 may have various shapes (e.g., one or more line shaped regions, one or more spot shaped regions, etc.) at a time for a given exposure. As such, the reflected light 108 from object 106 illuminates only a corresponding subset 113 of pixel circuits 112 of the pixel array 110 such that another subset 115 of the pixel array 110 is non-illuminated by the reflected light 108 from object 106 in accordance with the teachings of the present invention. In the various examples, the illuminated portion 107 of object 106 may be scanned across object 106 such that the illuminated subset of pixel circuits 113 of pixel array 110 is scanned across the pixel array 110 accordingly in time-of-flight light sensing system 100 in accordance with the teachings of the present invention.

In the depicted example, time-of-flight light sensing system 100 is a 3D camera that calculates image depth information of a scene (e.g., object 106) based on indirect time-of-flight (e.g., iToF) measurements with an image sensor that includes pixel array 110. In some examples, it is appreciated that although time-of-flight light sensing system 100 is capable of sensing 3D images, time-of-flight light system 100 may also be utilized to capture 2D images. In various examples, time-of-flight light sensing system 100 may also be utilized to capture high dynamic range (HDR) images.

Continuing with the depicted example, each pixel circuit 112 of pixel array 110 determines depth information for a corresponding portion of object 106 such that a 3D image of object 106 can be generated. As will be discussed, depth information is determined by driving the transfer gates of each pixel circuit 112 with differential phase modulation signals to measure the delay/phase difference between emitted light 104 and the received reflected light 108 to indirectly determine a round-trip time for light to propagate from light source 102 to object 106 and back to the pixel array 110 of time-of-flight light sensing system 100. The depth information may be based on an electric signal or charge that is photogenerated by the photodiode included in each pixel circuit 112, which is subsequently transferred to a storage node and read out.

As illustrated, light source 102 is configured to emit light 104 to the object 106 over a distance L. The emitted light 104 is then reflected from the object 106 as reflected light 108 (e.g., reflected light waves/pulses), some of which propagates towards the pixel array 110 of time-of-flight light sensing system 100 over the distance L and is incident upon the pixel circuits 112 of pixel array 110 as image light. Each pixel circuit 112 included in the pixel array 110 includes a photodetector (e.g., one or more photodiodes, avalanche photodiodes, or single-photon avalanche diodes, or the like) to detect the reflected light 108 and convert the reflected light 108 into an electric signal (e.g., electrons, image charge, etc.).

As shown in the depicted example, the round-trip time for emitted light 104 to propagate from light source 102 to object 106 and then be reflected back to pixel array 110 can be used to determine the distance L using the following relationships in Equations (1) and (2) below:

$$T_{TOF} = \frac{2L}{c} \quad (1)$$

$$L = \frac{T_{TOF} \cdot c}{2} \quad (2)$$

where c is the speed of light, which is approximately equal to $3 \times 10^8$ m/s, and $T_{TOF}$ corresponds to the round-trip time, which is the amount of time that it takes for the light to travel to and from the object 106 as shown in FIG. 1. Accordingly, once the round-trip time is known, the distance L may be calculated and subsequently used to determine depth information of object 106.

As shown in the depicted example, a control circuit 114 is coupled to pixel array 110 and light source 102, and includes logic and memory that when executed causes time-of-flight light sensing system 100 to perform operations for determining the round-trip time. Determining the round-trip time may be based on, at least in part, timing signals generated by control circuit 114. For indirect time-of-flight (iTOF) measurements, the timing signals are representative of the delay/phase difference between the light waves/pulses of when the light source 102 emits light 104 and when the photodetectors in pixel circuits 112 detect the reflected light 108.

In some examples, time-of-flight light sensing system 100 may be included in a device (e.g., a mobile phone, a tablet, a camera, etc.) that has size and power constraints determined, at least in part, based on the size of the device. Alternatively, or in addition, time-of-flight light sensing system 100 may have specific desired device parameters such as frame rate, depth resolution, lateral resolution, etc.

Figure 2:
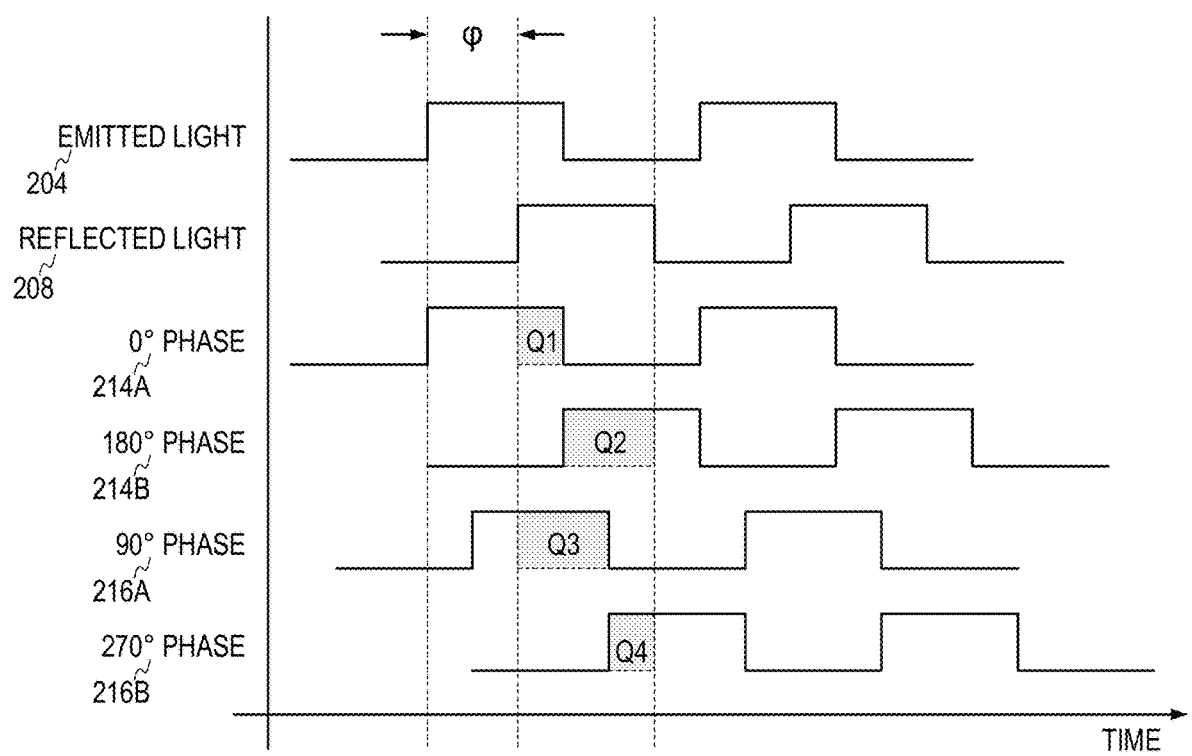
FIG. 2 is a timing diagram that shows an example of light pulses emitted from a light source relative to the receipt of the reflected light pulses and measurements using various phase shifts in an example time-of-flight sensing system accordance with the teachings of the present invention.

FIG. 2 is a timing diagram that illustrates the timing relationship between example light pulses emitted from a light source relative to the receipt of the reflected light pulses and measurements using various phase shifts in an example time-of-flight imaging system accordance with the teachings of the present invention. Specifically, FIG. 2 shows emitted light 204, which represents the modulated light pulses that are emitted from light source 102 to illuminate one or more portions 107 of object 106, and corresponding pulses reflected light 208, which represents the reflected light pulses that are back-reflected from the illuminated one or more portions 107 of object 106 and received by corresponding one or more portions 113 of the pixel circuits 112 pixel array 110 of FIG. 1.

The example depicted in FIG. 2 also illustrates measurement pulses of the differential phase modulation signals including a 0° phase modulation signal 214A and a 180° phase modulation signal 214B, as well as measurement pulses including a 90° phase modulation signal 216A and a 270° phase modulation signal 216B, which as shown are all phase-shifted relative to the phase of the pulses of emitted light 204. In addition, FIG. 2 shows that the 0° phase modulation signal 214A and 180° phase modulation signal 214B, as well as the 90° phase modulation signal 216A and 270° phase modulation signal 216B pulses are all modulated at the same frequency as the modulated emitted light 204 and reflected light 208 to realize homodyne detection of the reflected light 208 in accordance with the teachings of the present invention. Utilizing the different phases for the example measurement pulses as shown allows reconstruction of the encoded distance. In the various examples, at least 3 independent measurements (e.g., sub-frames) are utilized to decode 3 unknowns: distance/phase, reflectivity, and ambient. In examples described herein, 4 phases are utilized (e.g., 0°, 180°, 90°, and 270°).

As will be discussed, the 0° phase modulation signal 214A and 180° phase modulation signal 214B, as well as the 90° phase modulation signal 216A and 270° phase modulation signal 216B pulses correspond to the switching of transfer transistors that are included in the pixel circuits 112 of pixel array 110. In operation, the switching of the transfer transistors in the pixel circuits 112 of pixel array 110 can be used to measure the charge that is photogenerated in the one or more photodiodes that are included the pixel circuits 112 in response to the reflected light 208 to determine the delay or phase difference φ between the pulses of emitted light 204 and the corresponding pulses of reflected light 208.

For instance, the example illustrated in FIG. 2 shows that charge Q1 is photogenerated by the pulses of 0° phase modulation signal 214A and that charge Q2 is photogenerated by the pulses of 180° phase modulation signal 214B in response to reflected light 208. Similarly, charge Q3 is photogenerated by the pulses of 90° phase 216A and charge Q4 is photogenerated by the pulses of 270° phase modulation signal 216B in response to reflected light 208. In various examples, the measurements of Q1, Q2, Q3, and Q4 can then be used to determine the delay or phase difference φ between the emitted light 204 and the reflected light 208, and therefore the time of flight $T_{TOF}$ of light from the light source 102 to the object 106 and then back to the pixel array 110 in accordance with the teachings of the present invention.

FIGS. 3A-3F are diagrams of various examples of time-of-flight pixel arrays 310A-310F of a time-of-flight sensor on which the field-of-view for a given exposure is varied or programmed to include one or more fractional portions of the time-of flight pixel arrays, which are scanned by an example time-of-flight light sensing system in accordance with the teachings of the present invention. It is appreciated that the example pixel arrays 310A-310F illustrated in FIGS. 3A-3F may be examples of pixel array 110 shown in FIG. 1, and that similarly named and numbered elements described above are coupled and function similarly below.

Figure 3A:
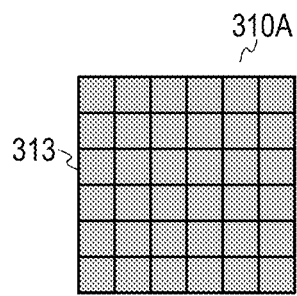
FIGS. 3A-3F are diagrams of various examples of time-of-flight pixel arrays on which the field-of-view for a given exposure is varied or programmed to include one or more fractional portions of the time-of flight pixel arrays, which are scanned by an example time-of-flight light sensing system in accordance with the teachings of the present invention.

In particular, FIG. 3A shows an example in which the illumination field-of-view includes the entire pixel array 310A. In a flash lidar (light detection and ranging), the entire field-of-view is illuminated by light reflected from an object that is illuminated by the illumination source. As such, the illuminated portion 313 of pixel array 310A is illustrated in FIG. 3A to cover the entire pixel array 310A. Consequently, in the example depicted in FIG. 3A, the illumination source is typically operated at the strongest intensity for which peak power, electromagnetic interference (EMI), thermal management, etc., can be tolerated. The illumination time is limited by either motion blur or safety requirements. Typically, long exposure times (~ms) result. During these long exposures times, significant amounts of undesired background signal from ambient light and dark current is accumulated. This presents a tremendous challenge for outdoor operation as well as for non-Silicon devices (SiGe, Ge, InGaAs, InP, GaAs, etc.), which exhibit significantly higher dark current. Another challenge related to the long exposure times is that the demodulation signaling, which is one of the key power contributors of indirect time-of-flight sensing, has to operate for the entire duration on the entire pixel array 310A.

Figure 3B:
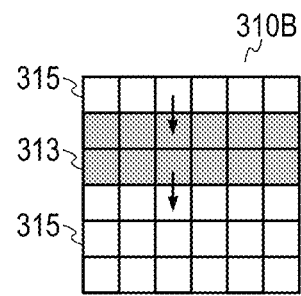

In comparison, FIG. 3B shows an example pixel array 310B in which only a fractional portion or a subset 313 of the pixel circuits of pixel array 310B is illuminated by light reflected from an object that is illuminated by the illumination source in accordance with the teachings of the present invention. As such, another subset 315 of pixel circuits of pixel array 310B is non-illuminated by the light reflected from the object. In the example shown in FIG. 3B, a horizontal line shaped portion or subset 313 of one or more rows of pixel array 310B is illuminated by the reflected light. In various examples, the subset 313 of pixel circuits of pixel array 310B that is illuminated by the reflected light may be scanned across the pixel array 310B until the entire frame captured.

Figure 3C:
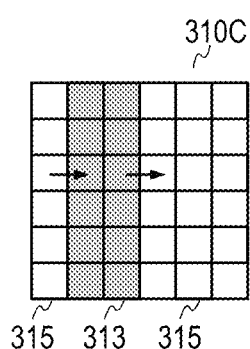

FIG. 3C shows another example pixel array 310C in which only a fractional portion or a subset 313 of the pixel circuits of pixel array 310C is illuminated by light reflected from an object that is illuminated by the illumination source. As such, another subset 315 of pixel circuits of pixel array 310C is non-illuminated by the light reflected from the object. In the example shown in FIG. 3C, a vertical line shaped portion or subset 313 of one or more columns of pixel array 310C is illuminated by the reflected light. In various examples, the subset 313 of pixel circuits of pixel array 310C that is illuminated by the reflected light may be scanned across the pixel array 310C until the entire frame captured.

Figure 3D:
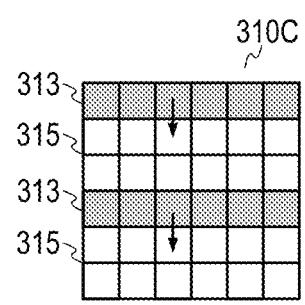

FIG. 3D shows yet another example pixel array 310D in which only a fractional portion or a subset 313 of the pixel circuits of pixel array 310D is illuminated by light reflected from an object that is illuminated by the illumination source. As such, another subset 315 of pixel circuits of pixel array 310D is non-illuminated by the light reflected from the object. In the example shown in FIG. 3D, horizontal line shaped portions or subset 313 of one or more rows of pixel array 310D are illuminated by the reflected light. The example depicted in FIG. 3D shows that the illuminated portions or subset 313 may be non-contiguous portions of the pixel array 310D. In various examples, the portions of pixel array 310D that are illuminated by the reflected light may be scanned across the pixel array 310D until the entire frame captured.

Figure 3E:
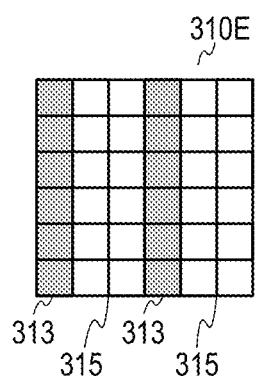

FIG. 3E shows still another example pixel array 310E in which only a fractional portion or a subset 313 of the pixel circuits of pixel array 310E is illuminated by light reflected from an object that is illuminated by the illumination source. As such, another subset 315 of pixel circuits of pixel array 310E is non-illuminated by the light reflected from the object. In the example shown in FIG. 3E, vertical line shaped portions of one or more columns of pixel array 310E are illuminated by the reflected light. The example depicted in FIG. 3E shows that the illuminated portions or subset 313 may be non-contiguous portions of the pixel array 310E. In various examples, the portion of pixel array 310E that is illuminated by the reflected light may be scanned across the pixel array 310E until the entire frame captured.

Figure 3F:
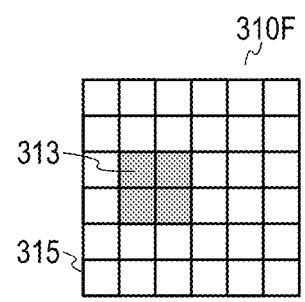

FIG. 3F shows yet another example pixel array 310F in which only a fractional portion or a subset 313 of the pixel circuits of pixel array 310F is illuminated by light reflected from an object that is illuminated by the illumination source. As such, another subset 315 of pixel circuits of pixel array 310F is non-illuminated by the light reflected from the object. In the example shown in FIG. 3F, a spot shaped portion of one or more pixel circuits of pixel array 310F are illuminated by the reflected light. In various examples, the subset 313 of pixel circuits of pixel array 310F that is illuminated by the reflected light may be randomly accessible or addressable. As such, by providing a random access illumination/exposure, a region-of-interest (ROI) may be monitored by the time-of-flight sensing system. In the various example, the ROI may be updated quickly by the host based on changes in the observed data stream/scenery. In various examples, the host may track objects and adjust the ROI accordingly in accordance with the teachings of the present invention.

Therefore, with regard to all of the examples depicted in FIGS. 3B-3F, instead of distributing a certain radiant flux Φ over a given solid angle Ω corresponding to an entire defined field-of-view (FOV) for a given exposure $T_{INT}$, the entire radiant flux Φ may instead be focused into an angle $\Delta\Omega = \Omega/N$, which illuminates only a 1/N portion of the object instead of the entire object. As such, there are one or more portions of the object in the field-of-view that are non-illuminated by the modulated light emitted by the light source in accordance with the teachings of the present invention. Accordingly, the reflected modulated light from the object illuminates only a subset 313 of the time-of-flight pixel circuits in the pixel arrays 310B-310F as shown in FIGS. 3B-3F. As such, another subset 315 of the time-of-flight pixel circuits in the pixel arrays 310B-310F shown in FIGS. 3B-3F is non-illuminated. This increases the irradiance to E×N, which reduces the exposure to $T_{INT}/N$ resulting in the same signal carrier count. However, since the exposure is reduced to $T_{INT}/N$, so is the parasitically generated background signal.

In operation, after the first $\Delta\Omega 1$ is illuminated for $T_{INT}/N$ and the corresponding subset of pixel circuits of the pixel array is read out, the emitted modulated light from the light source may then be scanned across the object, which therefore results in the reflected modulated light from the object to be scanned across the pixel arrays 310B-310F as shown. In other words, the radiant flux $\Phi$ may then be scanned or focused on $\Delta\Omega 1, \Delta\Omega 2, \ldots \Delta\Omega N$ across the object for given exposures until the entire frame is captured in the same total exposure $T_{INT}$ in accordance with the teachings of the present invention. It is appreciated therefore that example time-of-flight sensing systems in which only fractional portions of the objects are illuminated at a time, and therefore the corresponding illuminated fractional portions of pixel arrays 310B-310F are scanned have the advantage that modulation power is efficiently utilized, with a power consumption reduction by factor N in accordance with the teachings of the present invention.

Figure 4:
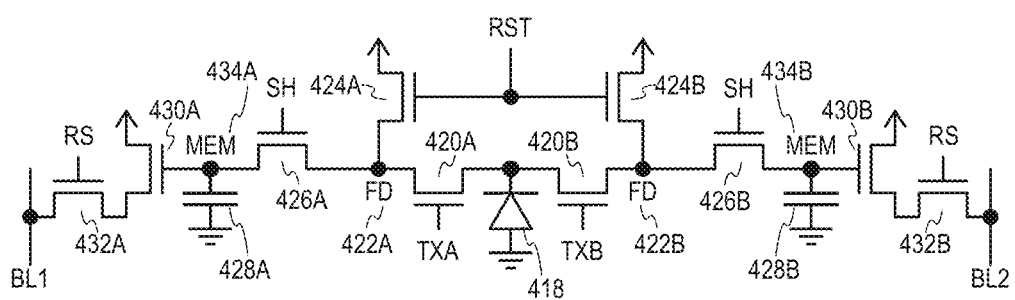
FIG. 4 is a schematic illustrating one example of a time-of-flight pixel circuit included in a time-of-flight pixel array of a time-of-flight sensing system in accordance with the teachings of the present invention.

FIG. 4 is a schematic illustrating one example of a time-of-flight pixel circuit 412 included in a pixel array of a time-of-flight sensor in accordance with the teachings of the present invention. It is appreciated that the pixel circuit 412 of FIG. 4 may be an example of one of the pixel circuits 112 included in pixel array 110 shown in FIG. 1, and that similarly named and numbered elements described above are coupled and function similarly below.

As shown in the example depicted in FIG. 4, pixel circuit 412 includes a photodiode 418 configured to photogenerate charge in response to incident light. In one example, the light that is incident on photodiode 418 is the reflected modulated light 108 that is reflected from an object 106 as described in FIG. 1. A first floating diffusion FD 422A is configured to store a first portion of charge photogenerated in the photodiode 418, such as for example charge Q1 or Q3 described in FIG. 2. A second floating diffusion FD 422B is configured to store a second portion of charge photogenerated in the photodiode 418, such as for example charge Q2 or Q4 described in FIG. 2.

A first transfer transistor 420A is configured to transfer the first portion of charge from the photodiode 418 to the first floating diffusion FD 422A in response to a first phase modulation signal TXA. In one example, the first phase modulation signal TXA may be an example of one of the phase modulation signals described in FIG. 2, such as for example 0° phase modulation signal 214A or 90° phase modulation signal 214C. A second transfer transistor 420B is configured to transfer the second portion of charge from the photodiode 418 to the second floating diffusion FD 422B in response to a second phase modulation signal TXB. In one example, the second phase modulation signal TXB may be an example of another one of the phase modulation signals described in FIG. 2, such as for example 180° phase modulation signal 214B or 270° phase modulation signal 214D. In the various examples, the first phase modulation signal TXA and the second phase modulation signal TXB are out of phase with each other, such as for example 180° out of phase with each other. In the example, a first storage node MEM 434A is configured to store the first portion of charge from the first floating diffusion FD 422A through a first sample and hold transistor 426A, and a second storage node MEM 434B is configured to store the second portion of charge from the second floating diffusion FD 422B through a second sample and hold transistor 426B. In the various examples, the first and second sample and hold transistors 426A and 426B are coupled to be responsive to a sample and hold signal SH.

Continuing with the example depicted in FIG. 4, the first storage node MEM 434A is coupled to a first capacitor 428A and a gate of a first source follower transistor 430A. A first row select transistor 432A is coupled to a source of the first source follower transistor 430A. In the various examples, the first row select transistor 432A is also coupled to a first bitline BL1, through which first output signal information may be read out from pixel circuit 412. Similarly, the second storage node MEM 434B is coupled to a second capacitor 428B and a gate of a second source follower transistor 430B. A second row select transistor 432B is coupled to a source of the second source follower transistor 430B. In the various examples, the second row select transistor 432B is also coupled to a second bitline BL2, through which second output signal information may be read out from pixel circuit 412. In the various examples, the first and second row select transistors 432A and 432B are coupled to be responsive to a row select signal RS.

In the various examples, pixel circuit 412 also includes a first reset transistor 424A coupled between a supply rail and the first floating diffusion FD 422A. In various examples, first reset transistor 424A is configured to reset the first floating diffusion FD 422A as well the first storage node MEM 434A in response to a reset signal RST. In the example depicted in FIG. 4, the first reset transistor 424A is configured to reset the first storage node MEM 434A through the first sample and hold transistor 426A. In various examples, it is appreciated that first reset transistor 424A may be operated in a way that excess carriers generated by photodiode 418 may be guided to the power supply by first reset transistor 424A or in a way that photosensitivity of photodiode 418 is disabled.

Similarly, pixel circuit 412 also includes a second reset transistor 424B coupled between the supply rail and the second floating diffusion FD 422B. In various examples, second reset transistor 424B is configured to reset the second floating diffusion FD 422B as well the second storage node MEM 434B in response to the reset signal RST. In the example depicted in FIG. 4, the second reset transistor 424B is configured to reset the second storage node MEM 434B through the second sample and hold transistor 426B. In various examples, it is appreciated that second reset transistor 424B may be operated in a way that excess carriers generated by photodiode 418 may be guided to the power supply by second reset transistor 424B or in a way that photosensitivity of photodiode 418 is disabled.

Figure 5A:
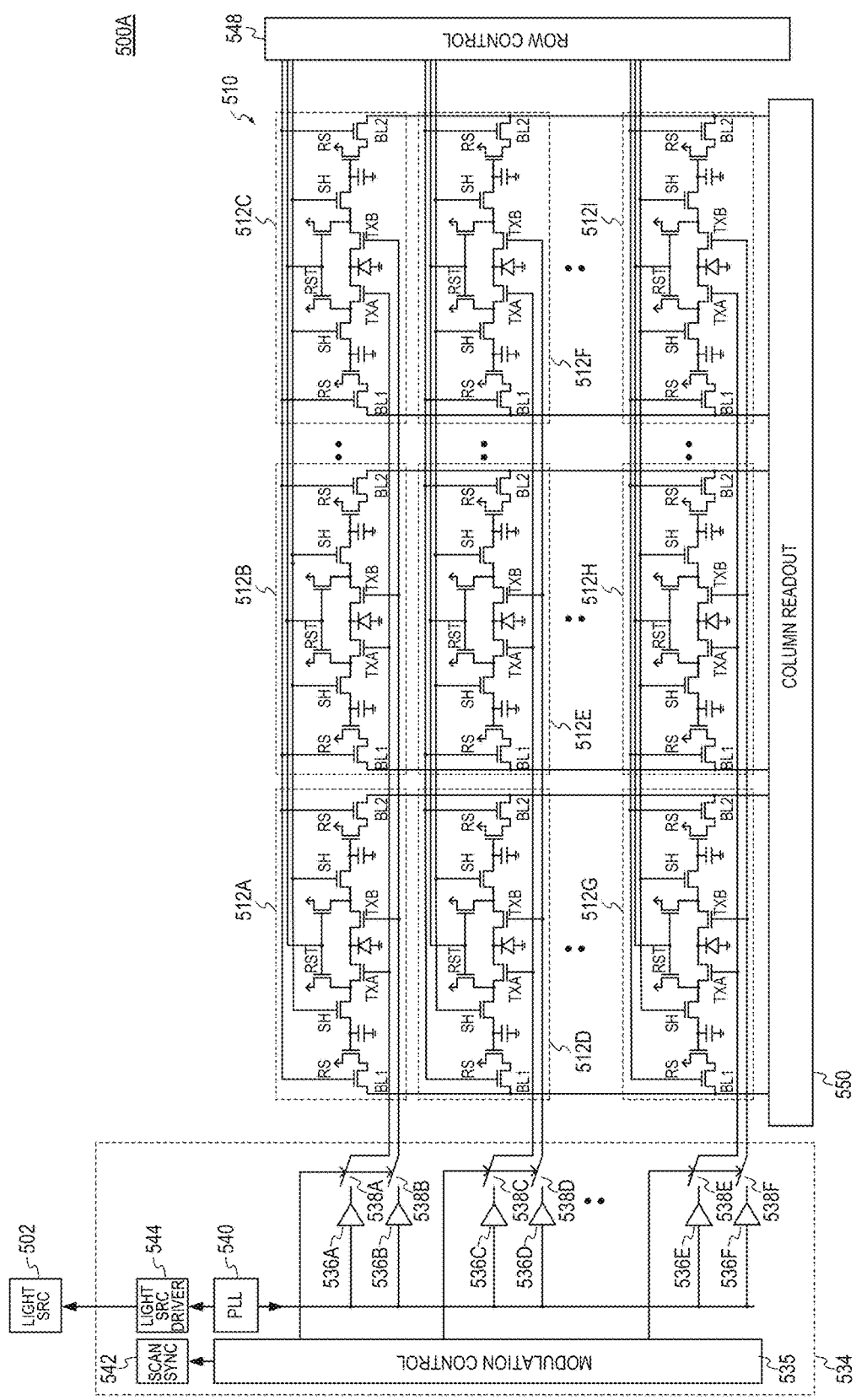
FIG. 5A is a schematic that shows one example of a time-of-flight light sensing system in accordance with the teachings of the present invention.

FIG. 5A is a schematic that shows one example of a time-of-flight light sensing system 500A in accordance with the teachings of the present invention. It is appreciated that the time-of-flight light sensing system 500A of FIG. 5A may be an example of the time-of-flight light sensing system 100 shown in FIG. 1, and that similarly named and numbered elements described above are coupled and function similarly below.

As shown in the depicted example, time-of-flight light sensing system 500A includes a light source 502 that is synchronized with a time-of-flight sensor including a pixel array 510. In the various examples, the light source 502 is configured to emit modulated light to only a portion of an object at a time, such as for example portion 107 of object 106 as illustrated for example in FIG. 1. In various examples, a laser may be employed as the light source 502, and the field-of-view of the laser may be controllable by various examples of scanning mechanisms. For instance, in various examples, the light source 502 may be implemented electronically (e.g., via an addressable laser array), or mechanically (e.g., via a bulk or a MEMS mirror), or optically/photonically (e.g., via a phased array, liquid crystal, etc.), or with any other suitable type of light source or technique to emit the modulated light to the object in accordance with the teachings of the present invention.

In the depicted example, the time-of-flight sensor also includes a modulation driver block 534, which is coupled to the light source 502 and the pixel array 510. In operation, the control and readout of the enabled and disabled time-of-flight pixel circuits included in time-of-flight pixel array 510 is synchronized with the modulated light that is emitted by light source 502 to the object. As shown in the depicted example, time-of-flight pixel array 510 includes a plurality of time-of-flight pixel circuits 512A-512I. In the example, it is noted that each of the time-of-flight pixel circuits 512A-512I may be an example of the time-of-flight pixel circuit 412 described in detail in FIG. 4. Therefore, it is appreciated that each of the time-of-flight pixel circuits 512A-512I is not described again in detail in FIG. 5A for the sake of brevity.

In the example depicted in FIG. 5A, the time-of-flight pixel circuits 512A-512I are arranged into rows and columns in time-of-flight pixel array 510. It is noted that time-of-flight pixel array 510 is illustrated with time-of-flight pixel circuits 512A-512I arranged into 3 rows and 3 columns for explanation purposes. In other examples, it is appreciated of course that the time-of-flight pixel array 510 may include a greater or fewer number of rows and/or a greater or fewer number of columns.

FIG. 5A depicts an example in which the reflected modulated light from the object is configured to illuminate one or more rows of time-of-flight pixel array 510, but not all of the rows of the time-of-flight pixel array 510 at a time. For instance, a first subset of the plurality of time-of-flight pixel circuits (e.g., the row including time-of-flight pixel circuits 512A-512C) is configured to be illuminated by the reflected modulated light from the object while a second subset of the plurality of time-of-flight pixel circuits (e.g., the rows including time-of-flight pixel circuits 512D-512I) is configured to be non-illuminated by the reflected modulated light from the object.

As shown in the depicted example, modulation driver block 534 includes a phase lock loop circuit 540, which is configured to generate the first and second phase modulation signals TXA and TXB. For instance, as described in the example of FIG. 4, the first and second phase modulation signals TXA and TXB are coupled to be received by the transfer transistors of time-of-flight pixel circuits 512A-512I. A light source driver 544 coupled between the light source 502 and the phase lock loop circuit 540. In operation, the light source driver circuit 544 is configured to synchronize the modulated light emitted from the light source 502 to the object with the first and second phase modulation signals TXA and TXB in response to the phase lock loop circuit 540.

Continuing with the depicted example, a plurality of driver circuits 536A-536F is coupled to the phase lock loop circuit 540. In the example, the driver circuit 536A is configured to generate the first phase modulation signal TXA and the driver circuit 536B is configured to generate the second phase modulation signal TXB for the row of time-of-flight pixel array 510 that includes time-of-flight pixels 512A-512C. The driver circuit 536C is configured to generate the first phase modulation signal TXA and the driver circuit 536D is configured to generate the second phase modulation signal TXB for the row of time-of-flight pixel array 510 that includes time-of-flight pixels 512D-512F. The driver circuit 536E is configured to generate the first phase modulation signal TXA and the driver circuit 536F is configured to generate the second phase modulation signal TXB for the row of time-of-flight pixel array 510 that includes time-of-flight pixels 512G-512I.

In the example, modulation driver block 534 also includes a plurality of driver switches 538A-538F. Each one of the plurality of driver switches 538A-538F is coupled to an output of a respective one of the plurality of driver circuits 536A-536F as shown in FIG. 5A. As such, driver switch 538A is coupled to an output of driver circuit 536A, driver switch 538B is coupled to an output of driver circuit 536B, driver switch 538C is coupled to an output of driver circuit 536C, driver switch 538D is coupled to an output of driver circuit 536D, driver switch 538E is coupled to an output of driver circuit 536E, and driver switch 538F is coupled to an output of driver circuit 536F.

As shown in the example, modulation driver block 534 also includes a modulation control circuit 535 that is coupled the plurality of driver switches 538A-538F. In operation, the modulation control circuit 535 is configured to turn off or disable the driver switches that are coupled to non-illuminated time-of-flight pixel circuits while the modulation control circuit 535 is configured to turn on or enable the driver switches that are coupled to illuminated time-of-flight pixel circuits.

To illustrate, in the example above in which the first subset of the plurality of time-of-flight pixel circuits (e.g., the row including time-of-flight pixel circuits 512A-512C) is configured to be illuminated by the reflected modulated light from the object while a second subset of the plurality of time-of-flight pixel circuits (e.g., the rows including time-of-flight pixel circuits 512D-512I) is configured to be non-illuminated by the reflected modulated light from the object, the modulation control circuit 535 is configured to turn on or enable driver switches 538A and 538B and turn off or disable driver switches 536C-536F. As such, the transfer transistors of the illuminated, and therefore enabled, time-of-flight pixel circuits 512A-512C are coupled to receive and be responsive to the first and second phase modulation signals TXA and TXB, while the the transfer transistors of the non-illuminated, and therefore disabled, time-of-flight pixel circuits 512D-512F are not coupled to receive and therefore not be responsive to the first and second phase modulation signals TXA and TXB.

Continuing with the depicted example, modulation driver block 534 further includes a scan synchronize circuit 542 coupled to the modulation control circuit 535 as shown. In operation, the scan synchronize circuit 542 is configured to synchronize the scanning of the modulated light emitted by the light source across the object with the scanning of the first subset of the plurality of time-of-flight pixel circuits that are illuminated by the reflected modulated light across the time-of-flight pixel array 510. In other words, the scan synchronize circuit 542 is configured to synchronize the scanning of the modulated light emitted by the light source 502 across the object with the activation of the appropriate driver switches 538A-538F that are coupled to the corresponding time-of-flight pixel circuits 512A-512I that are illuminated by the modulated light that is reflected from the object in accordance with the teachings of the present invention.

As shown in the depicted example, a row control circuit 548 is coupled to the plurality of time-of-flight pixel circuits 512A-512I of time-of-flight pixel array 510. In the example, the row control circuit 548 is configured to generate a reset signal RST that is coupled to control the first reset transistor and the second reset transistor of each one of the plurality of time-of-flight pixel circuits 512A-512I as shown. In the example, the row control circuit 548 is further configured to generate a sample and hold signal SH that is coupled to control the first sample and hold transistor and the second sample and hold transistor of each one of the plurality of time-of-flight pixel circuits 512A-512I as shown. In the example, the row control circuit 548 is further configured to generate a row select signal RS coupled to control the first row select transistor and the second row select transistor of each one of the plurality of time-of-flight pixel circuits 512A-512I as shown. In the depicted example, a column readout circuit 550 is coupled to the first bitline BL1 and the second bitline BL2 of each one of the plurality of time-of-flight pixel circuits 512A-512I to read out each one of the plurality of time-of-flight pixel circuits 512A-512I of time-of-flight pixel array 510 as shown.

Figure 5B:
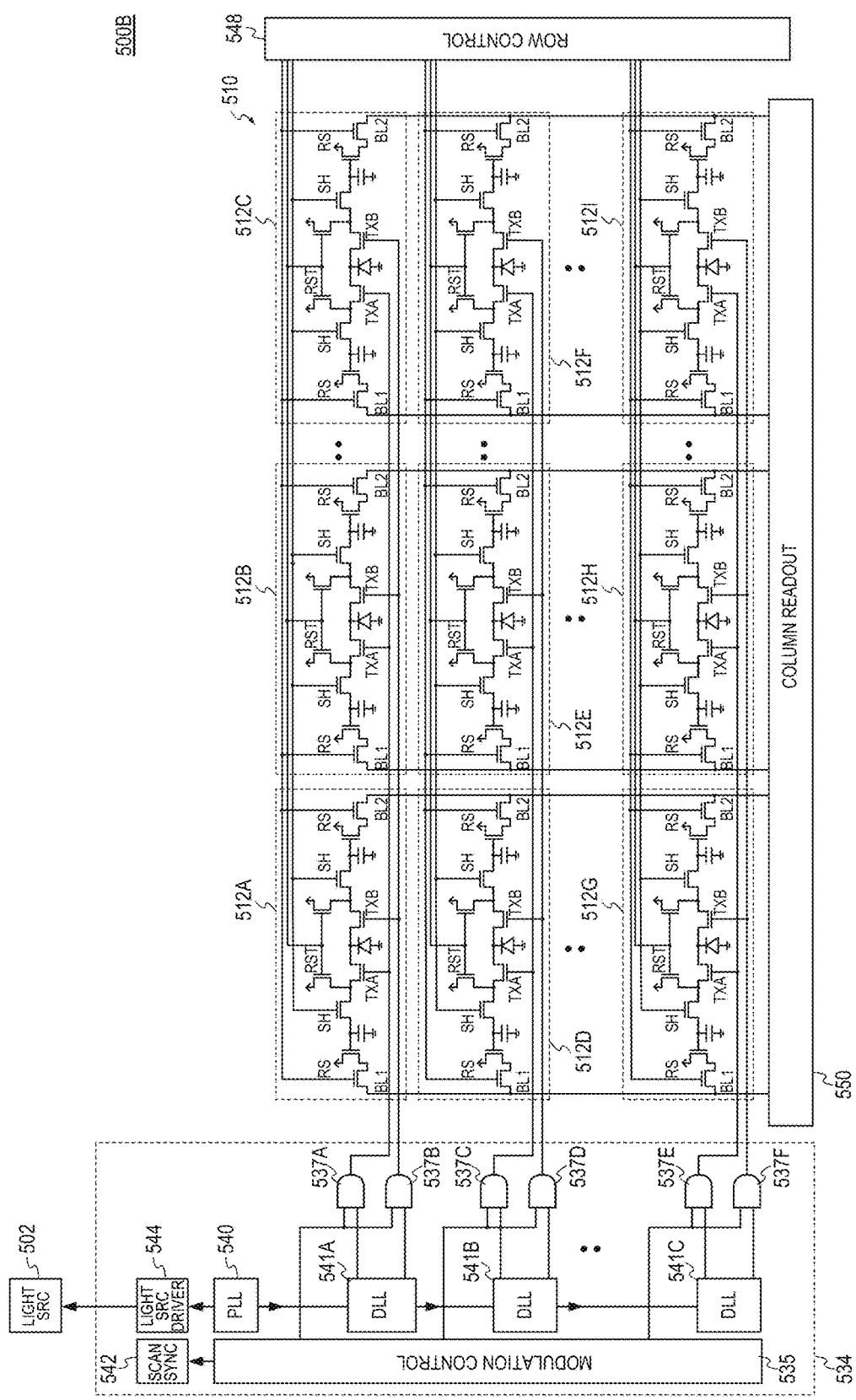
FIG. 5B is a schematic that shows another example of a time-of-flight light sensing system in accordance with the teachings of the present invention.

FIG. 5B is a schematic that shows another example of a time-of-flight light sensing system 500B in accordance with the teachings of the present invention. It is appreciated that the example time-of-flight light sensing system 500B of FIG. 5B may be another example of the time-of-flight light sensing system 500A of FIG. 5A, or another example of the time-of-flight light sensing system 100 shown in FIG. 1, and that similarly named and numbered elements described above are coupled and function similarly below. It also appreciated that the example time-of-flight light sensing system 500B of FIG. 5B shares many similarities with the example time-of-flight light sensing system 500A of FIG. 5A.

For instance, as shown in the example depicted in FIG. 5B, time-of-flight light sensing system 500B also includes a light source 502 that is synchronized with a time-of-flight sensor including a pixel array 510. In the various examples, the light source 502 is configured to emit modulated light to only a portion of an object at a time, such as for example portion 107 of object 106 as illustrated for example in FIG. 1. In various examples, a laser may be employed as the light source 502, and the field-of-view of the laser may be controllable by various examples of scanning mechanisms. For instance, in various examples, the light source 502 may also be implemented electronically (e.g., via an addressable laser array), or mechanically (e.g., via a bulk or a MEMS mirror), or optically/photonically (e.g., via a phased array, liquid crystal, etc.), or with any other suitable type of light source or technique to emit the modulated light to the object in accordance with the teachings of the present invention.

In the depicted example, the time-of-flight sensor also includes a modulation driver block 534, which is coupled to the light source 502 and the pixel array 510. In operation, the control and readout of the enabled and disabled time-of-flight pixel circuits included in time-of-flight pixel array 510 is synchronized with the modulated light that is emitted by light source 502 to the object. As shown in the depicted example, time-of-flight pixel array 510 also includes a plurality of time-of-flight pixel circuits 512A-512I. In the example, it is noted that each of the time-of-flight pixel circuits 512A-512I may also be an example of the time-of-flight pixel circuit 412 described in detail in FIG. 4. Therefore, it is appreciated that each of the time-of-flight pixel circuits 512A-512I is also not described again in detail in FIG. 5B for the sake of brevity.

In the example depicted in FIG. 5B, the time-of-flight pixel circuits 512A-512I are arranged into rows and columns in time-of-flight pixel array 510. It is noted that time-of-flight pixel array 510 is illustrated with time-of-flight pixel circuits 512A-512I arranged into 3 rows and 3 columns for explanation purposes. In other examples, it is appreciated of course that the time-of-flight pixel array 510 may include a greater or fewer number of rows and/or a greater or fewer number of columns.

FIG. 5B depicts an example in which the reflected modulated light from the object is configured to illuminate one or more rows of time-of-flight pixel array 510, but not all of the rows of the time-of-flight pixel array 510 at a time. For instance, a first subset of the plurality of time-of-flight pixel circuits (e.g., the row including time-of-flight pixel circuits 512A-512C) is configured to be illuminated by the reflected modulated light from the object while a second subset of the plurality of time-of-flight pixel circuits (e.g., the rows including time-of-flight pixel circuits 512D-512I) is configured to be non-illuminated by the reflected modulated light from the object.

As shown in the depicted example, modulation driver block 534 also includes a phase lock loop (PLL) circuit 540, which is configured to generate the first and second phase modulation signals TXA and TXB. One of the difference between time-of-flight pixel light sensing system 500B of FIG. 5B and time-of-flight pixel light sensing system 500A of FIG. 5A is that time-of-flight pixel light sensing system 500B of FIG. 5B also includes delay lock loop (DLL) circuits 541A, 541B, . . . , 541C, which are coupled in series to the output of the phase lock loop circuit 540. In the example, each of the delay lock loop circuits 541A, 541B, . . . , 541C is configured to generate the first and second phase modulation signals TXA and TXB with a respective phase shift or delay for the rows or groups of rows of the time-of-flight pixel array 510 that are coupled to the respective delay lock loop circuit 541A, 541B, . . . , 541C. It is appreciated that in another example, the delay lock loop circuits 541A, 541B, . . . , 541C could also be implemented to introduce the phase delay between rows or groups of columns of the time-of-flight pixel array depending on the configuration. As such, it is appreciated that deliberate phase-shift added with the delay lock loop circuits 541A, 541B, . . . , 541C which spreads out peak currents and hence improves the first and second phase modulation signals TXA and TXB and reduces electromagnetic interference (EMI) by avoiding excess current or power spikes when modulating the transfer transistors included in the time-of-flight pixel circuits 512A-512I of the time-of-flight pixel array 510 in accordance with the teachings of the present invention. As shown in the depicted example, the first and second phase modulation signals TXA and TXB generated by the phase lock loop (PLL) circuit 540 are generated by the respective series coupled delay lock loop (DLL) circuits 541A, 541B, . . . , 541C with the corresponding phase shift.

Another difference between time-of-flight pixel light sensing system 500B of FIG. 5B and time-of-flight pixel light sensing system 500A of FIG. 5A is that in time-of-flight pixel light sensing system 500B of FIG. 5B, each of the first and second phase modulation signals TXA and TXB generated by the respective delay lock loop (DLL) circuits 541A, 541B, . . . , 541C is received at a second input (e.g., bottom input) of a respective logic circuits 537A, 537B, 537C, 537D, . . . , 537E, 537F as shown. In the depicted example, the logic circuits 537A, 537B, 537C, 537D, . . . , 537E, 537F are illustrated as logical AND gates, which are configured to gate the first and second phase modulation signals TXA and TXB in response to a respective enable signal received at a first input (e.g., top input) of each of the logic circuits 537A, 537B, 537C, 537D, . . . , 537E, 537F. In other examples, it is appreciated that other suitable types of logic circuits or combinations of logic circuits could be utilized, such as for example NAND/OR/NOR gates, etc., depending on the polarity of the signals included in time-of-flight light sensing system 500B. In the example, the modulation control circuit 535 included in modulation driver block 534 is configured to generate the enable signal received at the first input of each of the logic circuits 537A, 537B, 537C, 537D, . . . , 537E, 537F. In operation, the modulation control circuit 535 is therefore configured to disable the respective logic circuits 537A, 537B, 537C, 537D, . . . , 537E, 537F that are coupled to non-illuminated time-of-flight pixel circuits while the modulation control circuit 535 is configured to enable the respective logic circuits 537A, 537B, 537C, 537D, . . . , 537E, 537F that are coupled to illuminated time-of-flight pixel circuits. Thus, the first and second phase modulation signals TXA and TXB are therefore generated at the respective outputs of each of the logic circuits 537A, 537B, 537C, 537D, . . . , 537E, 537F when a corresponding enable signal is received from the modulation control circuit 535.

Continuing with the example depicted in FIG. 5B, the first and second phase modulation signals TXA and TXB from the logic circuits 537A, 537B, 537C, 537D, . . . , 537E, 537F are coupled to be received by the transfer transistors of time-of-flight pixel circuits 512A-512I. For instance, in the depicted example, the logic circuit 537A is configured to generate the first phase modulation signal TXA and the logic circuit 537B is configured to generate the second phase modulation signal TXB for the row of time-of-flight pixel array 510 that includes time-of-flight pixels 512A-512C. The logic circuit 537C is configured to generate the first phase modulation signal TXA and the logic circuit 537D is configured to generate the second phase modulation signal TXB for the row of time-of-flight pixel array 510 that includes time-of-flight pixels 512D-512F. The logic circuit 537E is configured to generate the first phase modulation signal TXA and the logic circuit 537F is configured to generate the second phase modulation signal TXB for the row of time-of-flight pixel array 510 that includes time-of-flight pixels 512G-512I.

In operation, the first subset of the plurality of time-of-flight pixel circuits (e.g., the row including time-of-flight pixel circuits 512A-512C) is configured to be illuminated by the reflected modulated light from the object while a second subset of the plurality of time-of-flight pixel circuits (e.g., the rows including time-of-flight pixel circuits 512D-512I) is configured to be non-illuminated by the reflected modulated light from the object. As such, the modulation control circuit 535 is configured to enable logic circuits 537A and 537B and disable logic circuits 537C-537F. As such, the transfer transistors of the illuminated, and therefore enabled, time-of-flight pixel circuits 512A-512C are coupled to receive and be responsive to the first and second phase modulation signals TXA and TXB, while the transfer transistors of the non-illuminated, and therefore disabled, time-of-flight pixel circuits 512D-512F are not coupled to receive and therefore not be responsive to the first and second phase modulation signals TXA and TXB. Operation is similar for when the modulation control circuit 535 is configured to enable logic circuits 537C and 537D and disable logic circuits 537A-537B and 537E-537F, or when the modulation control circuit 535 is configured to enable logic circuits 537E and 537F and disable logic circuits 537A-537D, and so on.

A light source driver 544 coupled between the light source 502 and the phase lock loop circuit 540. In operation, the light source driver circuit 544 is configured to synchronize the modulated light emitted from the light source 502 to the object with the first and second phase modulation signals TXA and TXB in response to the phase lock loop circuit 540.

Continuing with the depicted example, modulation driver block 534 further includes a scan synchronize circuit 542 coupled to the modulation control circuit 535 as shown. In operation, the scan synchronize circuit 542 is configured to synchronize the scanning of the modulated light emitted by the light source across the object with the scanning of the first subset of the plurality of time-of-flight pixel circuits that are illuminated by the reflected modulated light across the time-of-flight pixel array 510. In other words, the scan synchronize circuit 542 is configured to synchronize the scanning of the modulated light emitted by the light source 502 across the object with the enabling of the appropriate logic circuits 537A-537F that are coupled to the corresponding time-of-flight pixel circuits 512A-512I that are illuminated by the modulated light that is reflected from the object in accordance with the teachings of the present invention.

As shown in the depicted example, a row control circuit 548 is coupled to the plurality of time-of-flight pixel circuits 512A-512I of time-of-flight pixel array 510. In the example, the row control circuit 548 is configured to generate a reset signal RST that is coupled to control the first reset transistor and the second reset transistor of each one of the plurality of time-of-flight pixel circuits 512A-512I as shown. In the example, the row control circuit 548 is further configured to generate a sample and hold signal SH that is coupled to control the first sample and hold transistor and the second sample and hold transistor of each one of the plurality of time-of-flight pixel circuits 512A-512I as shown. In the example, the row control circuit 548 is further configured to generate a row select signal RS coupled to control the first row select transistor and the second row select transistor of each one of the plurality of time-of-flight pixel circuits 512A-512I as shown. In the depicted example, a column readout circuit 550 is coupled to the first bitline BL1 and the second bitline BL2 of each one of the plurality of time-of-flight pixel circuits 512A-512I to read out each one of the plurality of time-of-flight pixel circuits 512A-512I of time-of-flight pixel array 510 as shown.

Figure 6:
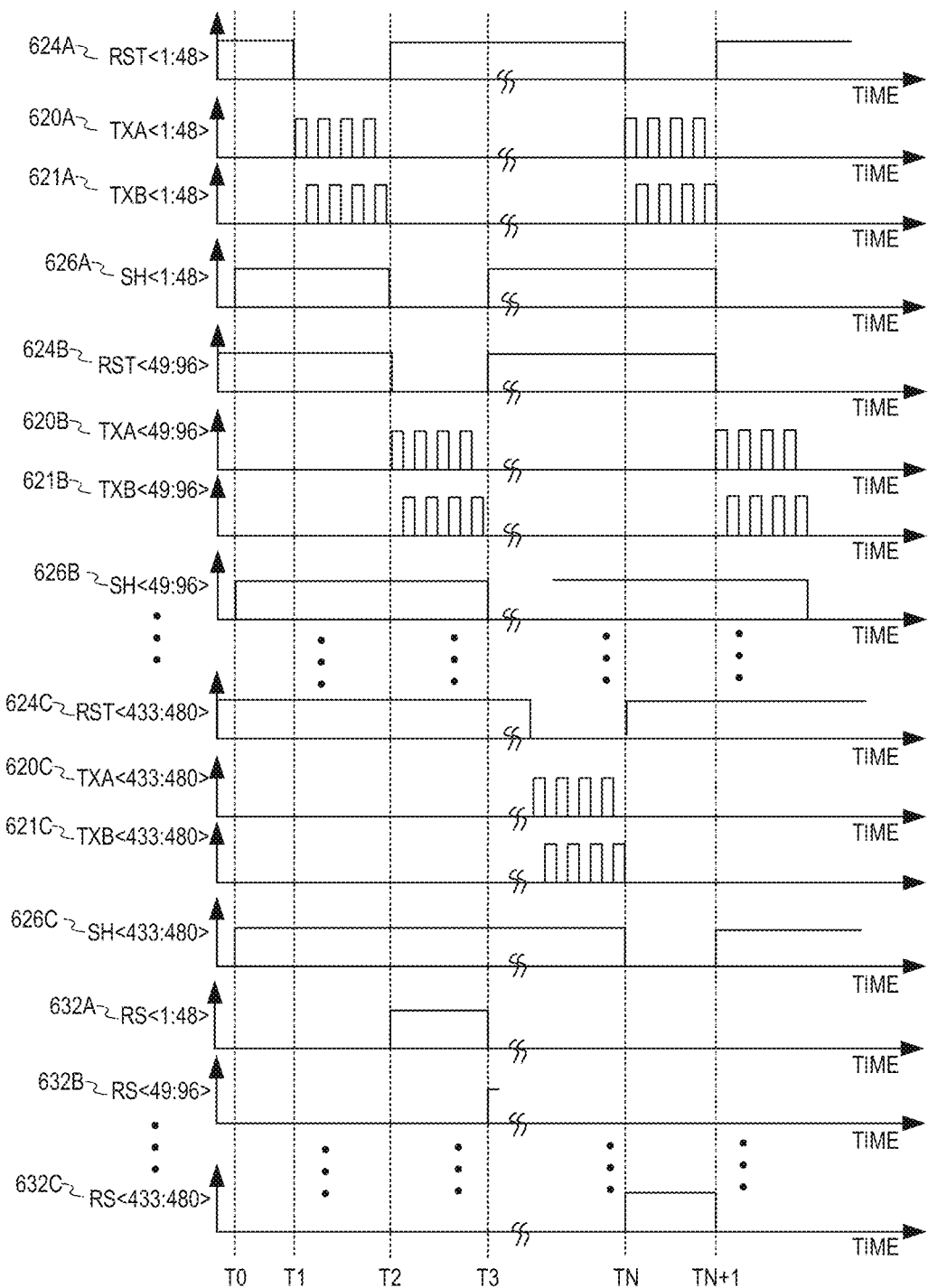
FIG. 6 is a timing diagram that shows one example of signals during integration and readout of one example of a time-of-flight light sensing system in accordance with the teachings of the present invention.

FIG. 6 is a timing diagram that shows one example of signals during integration and readout of one example of a time-of-flight light sensing system in accordance with the teachings of the present invention. It is appreciated that the signals illustrated in the timing diagram of FIG. 6 may examples of the signals found during operation of the time-of-flight sensing system 500A illustrated in FIG. 5A, and/or examples of signals found during operation of the time-of-flight pixel circuit 412 illustrated in FIG. 4, and/or examples of signals found during operation of the time-of-flight sensing system 100 illustrated in FIG. 1, and that similarly named and numbered elements described above are coupled and function similarly below.

In the example depicted FIG. 6, it is assumed for illustration purposes that a time-of-flight sensing system includes a time-of-flight pixel array with 480 rows of time-of-flight pixel circuits. As shown in the depicted example, at time T0, the reset signal RST<1:48>624A, which is coupled to the rows including the subset of time-of-flight pixel circuits included in rows 1-48, the reset signal RST<49:96>624B, which is coupled to the rows including the subset of time-of-flight pixel circuits included in rows 49-96, . . . , and the reset signal RST<433:480>624C, which is coupled to the rows including the subset of time-of-flight pixel circuits included in rows 433-480, are all activated which turns on the first and second reset transistors in the respective timeof-flight pixel circuits to initialize or reset the respective time-of-flight pixel circuits according.

At time T1, the reset signal RST<1:48>624A, which is coupled to the rows including the subset of time-of-flight pixel circuits included in rows 1-48, is deactivated and the first phase modulation signal TXA<1:48>620A and the second phase modulation signal TXB<1:48>621A are modulated to modulate the respective transfer transistors (e.g., 420A and 420B). As such, integration of the reflected modulated light incident upon the illuminated subset of time-of-flight pixel circuits included in rows 1-48 of the time-of-flight pixel array occurs between time T1 and T2. In the example, it is assumed that the subset of time-of-flight pixel circuits included in remaining the rows 49-480 are non-illuminated, and therefore remain deactivated between time T1 and T2.

At time T2, rows 1-48 are no longer illuminated and the reset signal RST<1:48>624A is reactivated and the sample and hold signal SH<1:48>626A, which is coupled to the rows included in the now non-illuminated subset of time-of-flight pixel circuits included in rows 1-48, is deactivated. In addition, the row select signal RS<1:48>632A is now activated. Thus, the respective charges sampled into the memory nodes (e.g., 434A and 434B) during the time interval between T1 and T2 of the respective time-of-flight pixel circuits are now held in the time interval between time T2 and T3. Therefore, the held charges in the memory nodes in the previously illuminated but now non-illuminated subset of time-of-flight pixel circuits included in rows 1-48 are now read out through the respective row select transistors (e.g., 4332A and 432B) during the time interval between time T2 and T3, as indicated with the assertion with the row select signal RS<1:48>632A.

In addition, it is also appreciated that at time T2, the previously non-illuminated subset of time-of-flight pixel circuits included in rows 49-96 during the time interval between time T1 and T2 is now illuminated during the time interval between time T2 and T3. As such at time T2, the reset signal RST<49:96>624B, which is coupled to the rows including the subset of time-of-flight pixel circuits included in rows 49-96, is now deactivated and the first phase modulation signal TXA<49:96>620B and the second phase modulation signal TXB<49:96>621B are modulated to modulate the respective transfer transistors (e.g., 420A and 420B) of the time-of-flight pixel circuits included in the now illuminated subset of time-of-flight pixel circuits included in rows 49-96 during the time interval between time T2 and T3. As such, integration of the reflected modulated light incident upon the now illuminated subset of time-of-flight pixel circuits included in rows 49-96 of the time-of-flight pixel array occurs between time T2 and T3. In the example, it is assumed that the subset of time-of-flight pixel circuits included in remaining the rows 1-48 and 97-480 are not illuminated, and therefore remain deactivated between time T2 and T3.

It is therefore appreciated that the simultaneous readout between time T2 and T3 of the subset of time-of-flight pixel circuits included in rows 1-48 at the same time as the integration of the subset of time-of-flight pixel circuits included in rows 49-96 illustrates pipelined integration and readout operations in the time-of-flight pixel array in accordance with the teachings of the present invention. As shown, the first and second storage nodes (e.g., first and second storage nodes MEM 434A and MEM 434B) of one of the plurality of time-of-flight pixel circuits included in the second subset (e.g., non-illuminated rows 1-48 during the time interval between T2 and T3) are configured to be read out through respective row select transistors (e.g., first and second row select transistors 432A and 432B) at the same time that the first and second transfer transistors (e.g., first and second transfer transistors 420A and 420B) of one of the plurality of time-of-flight pixel circuits included in the first subset (e.g., illuminated rows 49-96 during the time interval between T2 and T3) are configured to be modulated in response to the first and second phase modulation signals 620B, 621B.

In the next time period after time T3, the held charges in the memory nodes in the subset of time-of-flight pixel circuits included in rows 48-96 are read out when the subset of time-of-flight pixel circuits included in rows 48-96 are no longer illuminated, as indicated with the assertion with the row select signal RS<48:96>632B and the deactivation of sample and hold signal SH<49-96>626B at time T3. Furthermore, integration of the subsequently illuminated rows after rows 48-96 are no longer illuminated may now occur while the held charges in the memory nodes in the now non-illuminated subset of time-of-flight pixel circuits included in rows 48-96 are read out to continue pipelined integration and readout operations in the time-of-flight pixel array in accordance with the teachings of the present invention.

The pipelined integration and readout operations illustrated above are scanned across the time-of-flight pixel array and continue through the rows of the time-of-flight pixel array. As such, at the time period just prior to time TN, the reset signal RST<433:480>624C is deactivated and the first phase modulation signal TXA<433:480>620C and the second phase modulation signal TXB<433:480>621C are modulated to modulate the respective transfer transistors (e.g., 420A and 420B). As such, integration of the reflected modulated light incident upon the subset of time-of-flight pixel circuits included in rows 433-480 of the time-of-flight pixel array occurs in the time period just prior to time TN. In the example, it is assumed that the subset of time-of-flight pixel circuits included in remaining the rows 1-432 are not illuminated, and therefore remain deactivated in the time period just prior to time TN.

At time TN, the reset signal RST<433:480>624C is reactivated and the sample and hold signal SH<433:480>626C, which is coupled to the rows including the subset of time-of-flight pixel circuits included in rows 433-480 is deactivated. Thus, the respective charges sampled into the memory nodes (e.g., 434A and 434B) of the respective time-of-flight pixel circuits are held between time TN and TN+1. Therefore, the held charges in the memory nodes in the subset of time-of-flight pixel circuits included in rows 433-480 are readout between time TN and TN+1. Therefore, the held charges in the memory nodes in the subset of time-of-flight pixel circuits included in rows 433-480 are readout between time TN and TN+1, as indicated with the assertion with the row select signal RS<433:480>632C.

As shown in the example, the pipelined integration and readout operations of the time-of-flight pixel array then repeat and loop back to the subset of time-of-flight pixel circuits included in rows 1-48 of the time-of-flight pixel array. In particular, at time TN, like at time T1, the reset signal RST<1:48>624A, which is coupled to the rows including the subset of time-of-flight pixel circuits included in rows 1-48, is deactivated and the first phase modulation signal TXA<1:48>620A and the second phase modulation signal TXB<1:48>621A are modulated to modulate the respective transfer transistors (e.g., 420A and 420B). As such, integration of the reflected modulated light incident upon the subset of time-of-flight pixel circuits included in rows 1-48 of the time-of-flight pixel array occurs between time TN and TN+1, like at the time period between time T1 and T2. Similarly, the processing at time TN+1 corresponds to the process that occurs at time T2, and so on.

Figure 7:
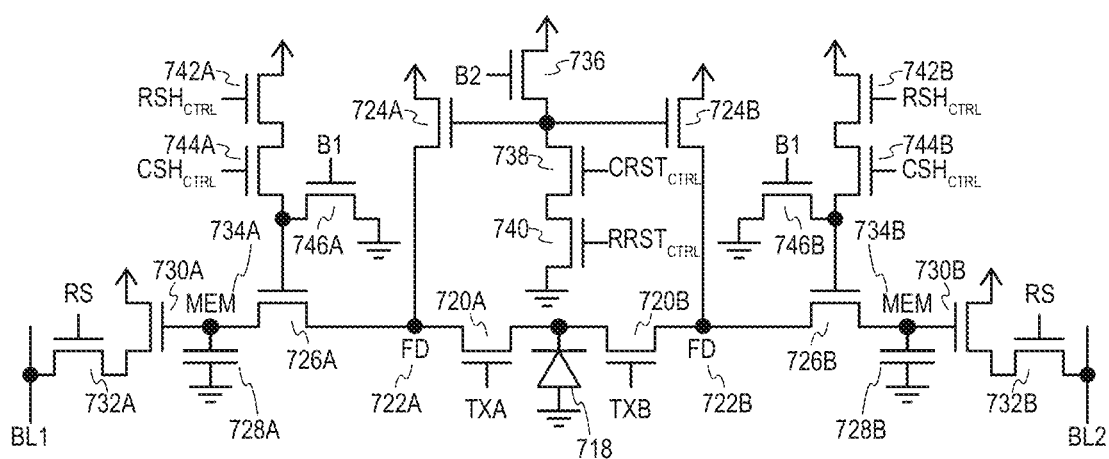
FIG. 7 is a schematic illustrating another example of a time-of-flight pixel circuit included in a time-of-flight pixel array of a time-of-flight sensing system in accordance with the teachings of the present invention.

FIG. 7 is a schematic illustrating another example of a time-of-flight pixel circuit 712 included in a time-of-flight pixel array of a time-of-flight sensing system in accordance with the teachings of the present invention. It is appreciated that the pixel circuit 712 of FIG. 7 may be another example of pixel circuit 412 of FIG. 4, or another example of one of the pixel circuits 112 included in pixel array 110 shown in FIG. 1, and that similarly named and numbered elements described above are coupled and function similarly below. It also appreciated that the example pixel circuit 712 of FIG. 7 shares many similarities with the example pixel circuit 412 of FIG. 4.

For instance, as shown in the example depicted in FIG. 7, pixel circuit 712 includes a photodiode 718 configured to photogenerate charge in response to incident light. In one example, the light that is incident on photodiode 718 is the reflected modulated light 108 that is reflected from an object 106 as described in FIG. 1. A first floating diffusion FD 722A is configured to store a first portion of charge photogenerated in the photodiode 718, such as for example charge Q1 or Q3 described in FIG. 2. A second floating diffusion FD 722B is configured to store a second portion of charge photogenerated in the photodiode 718, such as for example charge Q2 or Q4 described in FIG. 2.

A first transfer transistor 720A is configured to transfer the first portion of charge from the photodiode 718 to the first floating diffusion FD 722A in response to a first phase modulation signal TXA. In one example, the first phase modulation signal TXA may be an example of one of the phase modulation signals described in FIG. 2, such as for example 0° phase modulation signal 214A or 90° phase modulation signal 214C. A second transfer transistor 720B is configured to transfer the second portion of charge from the photodiode 718 to the second floating diffusion FD 722B in response to a second phase modulation signal TXB. In one example, the second phase modulation signal TXB may be an example of another one of the phase modulation signals described in FIG. 2, such as for example 180° phase modulation signal 214B or 270° phase modulation signal 214D. In the various examples, the first phase modulation signal TXA and the second phase modulation signal TXB are out of phase with each other, such as for example 180° out of phase with each other.

Similar to the example pixel circuit 412 of FIG. 4, pixel circuit 712 of FIG. 7 also includes a first storage node MEM 734A that configured to store the first portion of charge from the first floating diffusion FD 722A through a first sample and hold transistor 726A, and a second storage node MEM 734B that is configured to store the second portion of charge from the second floating diffusion FD 722B through a second sample and hold transistor 726B.

One of the differences between pixel circuit 712 of FIG. 7 and pixel circuit 412 of FIG. 4 is that the pixel circuit 712 of FIG. 7 also includes a first column sample and hold control transistor 744A coupled to a gate of the first sample and hold transistor 726A. In the example, the first column sample and hold control transistor 744A is coupled to be responsive to a first column sample and hold control signal $CSH_{CTRL}$. In addition, a first row sample and hold control transistor 742A is coupled to the first column sample and hold control transistor 744A as shown. The first row sample and hold control transistor 742A is coupled to be responsive to a row sample and hold control signal $RSH_{CTRL}$. In addition, a first sample and hold enable/disable transistor 746A is also coupled to the gate of the first sample and hold transistor 726A. The first sample and hold enable/disable transistor 746A is coupled to be responsive to a sample and hold enable/disable control signal B1.

Similarly, pixel circuit 712 of FIG. 7 also includes a second column sample and hold control transistor 744B coupled to a gate of the second sample and hold transistor 726B. The second column sample and hold control transistor 744B is coupled to be responsive to a second column sample and hold control signal $CSH_{CTRL}$. In one example, the first and second column sample and hold control signals $CSH_{CTRL}$ may be the same signal. In addition, a second row sample and hold control transistor 742B is coupled to the second column sample and hold control transistor 744B as shown. The second row sample and hold control transistor 742B is coupled to be responsive to the row sample and hold control signal $RSH_{CTRL}$. In addition, a second sample and hold enable/disable transistor 746B is coupled to the gate of the second sample and hold transistor 726B. The second sample and hold enable/disable transistor 746B is coupled to be responsive to the sample and hold enable/disable control signal B1.

Therefore, in the various examples, the first sample and hold transistor 726A is coupled to be responsive to the first column sample and hold control signal $CSH_{CTRL}$, the row sample and hold control signal $RSH_{CTRL}$, and the sample and hold enable/disable control signal B1. Similarly, the second sample and hold transistor 726B is coupled to be responsive to the second column sample and hold control signal $CSH_{CTRL}$, the row sample and hold control signal $RSH_{CTRL}$, and the sample and hold enable/disable control signal B1. In various examples, the first and second column sample and hold control signals $CSH_{CTRL}$ may be the same signal.

Continuing with the example depicted in FIG. 7, the first storage node MEM 734A is coupled to a first capacitor 728A and a gate of a first source follower transistor 730A. A first row select transistor 732A is coupled to a source of the first source follower transistor 730A. In the various examples, the first row select transistor 732A is also coupled to a first bitline BL1, through which first output signal information may be read out from pixel circuit 712. Similarly, the second storage node MEM 734B is coupled to a second capacitor 728B and a gate of a second source follower transistor 730B. A second row select transistor 732B is coupled to a source of the second source follower transistor 730B. In the various examples, the second row select transistor 732B is also coupled to a second bitline BL2, through which second output signal information may be read out from pixel circuit 712. In the various examples, the first and second row select transistors 732A and 732B are coupled to be responsive to a row select signal RS.

Similar to the example pixel circuit 412 of FIG. 4, pixel circuit 712 of FIG. 7 also includes a first reset transistor 724A coupled between a supply rail and the first floating diffusion FD 722A and a second reset transistor 724B coupled between the supply rail and the second floating diffusion FD 722B.

Another one of the differences between pixel circuit 712 of FIG. 7 and pixel circuit 412 of FIG. 4 is that the pixel circuit 712 of FIG. 7 also includes a column reset control transistor 738 coupled to a gate of the first reset transistor 724A and a gate of the second reset transistor 724B. The column reset control transistor is coupled to be responsive to a column reset control signal $CRST_{CTRL}$. In addition, a row reset control transistor 740 is coupled to the column reset control transistor 738. The row reset control transistor 740 is coupled to be responsive to a row reset control signal $RRST_{CTRL}$. In addition, a reset enable/disable transistor 736 is also coupled to the gate of the first reset transistor 724A and the gate of the second reset transistor 724B as shown. The reset enable/disable transistor is coupled to be responsive to a reset enable/disable control signal B2.

Therefore, in the various examples, the first and second reset transistors 724A and 724B are coupled to be responsive to column reset control signal $CRST_{CTRL}$, row reset control signal $RRST_{CTRL}$, and the reset enable/disable control signal B2.

In various examples, first reset transistor 724A is configured to reset the first floating diffusion FD 722A as well the first storage node MEM 734A. In the example depicted in FIG. 7, the first reset transistor 724A is configured to reset the first storage node MEM 734A through the first sample and hold transistor 726A. In various examples, it is appreciated that first reset transistor 724A may be operated in a way that excess carriers generated by photodiode 718 may be guided to the power supply by first reset transistor 724A or in a way that photosensitivity of photodiode 718 is disabled. Similarly, second reset transistor 724B is configured to reset the second floating diffusion FD 722B as well the second storage node MEM 734B. In the example depicted in FIG. 7, the second reset transistor 724B is configured to reset the second storage node MEM 734B through the second sample and hold transistor 726B. In various examples, it is appreciated that second reset transistor 724B may be operated in a way that excess carriers generated by photodiode 718 may be guided to the power supply by second reset transistor 724B or in a way that photosensitivity of photodiode 718 is disabled.

Figure 8:
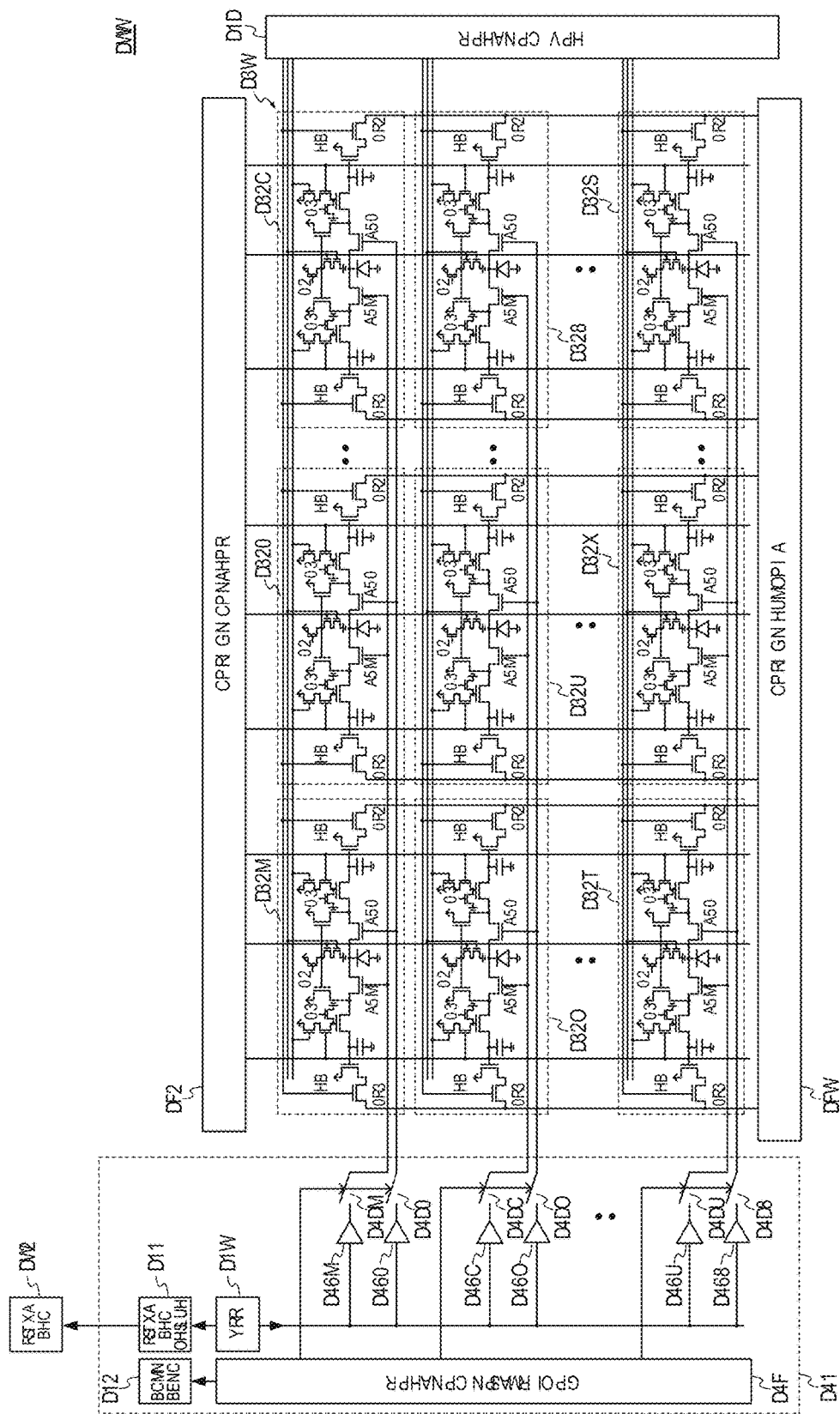
FIG. 8 is a schematic that shows yet another example of a time-of-flight light sensing system in accordance with the teachings of the present invention.

FIG. 8 is a schematic that shows yet another example of a time-of-flight light sensing system 800 in accordance with the teachings of the present invention. It is appreciated that the example time-of-flight light sensing system 800 of FIG. 8 may be another example of the time-of-flight light sensing system 500A of FIG. 5A, or another example of the time-of-flight light sensing system 100 shown in FIG. 1, and that similarly named and numbered elements described above are coupled and function similarly below. It also appreciated that the example time-of-flight light sensing system 800 of FIG. 8 shares many similarities with the example time-of-flight light sensing system 500A of FIG. 5A.

For instance, as shown in the example depicted in FIG. 8, the example time-of-flight light sensing system 800 includes a light source 802 that is synchronized with a time-of-flight sensor including a pixel array 810. In the various examples, the light source 802 is configured to emit modulated light to only a portion of an object at a time, such as for example portion 107 of object 106 as illustrated for example in FIG. 1. In various examples, a laser may be employed as the light source 802, and the field-of-view of the laser may be controllable by various examples of scanning mechanisms. For instance, in various examples, the light source 802 may be implemented electronically (e.g., via an addressable laser array), or mechanically (e.g., via a bulk or a MEMS mirror), or optically/photonically (e.g., via a phased array, liquid crystal, etc.), or with any other suitable type of light source or technique to emit the modulated light to the object in accordance with the teachings of the present invention.

In the depicted example, the time-of-flight sensor also includes a modulation driver block 834, which is coupled to the light source 802 and the pixel array 810. In operation, the control and readout of the enabled and disabled time-of-flight pixel circuits included in time-of-flight pixel array 810 is synchronized with the modulated light that is emitted by light source 802 to the object. As shown in the depicted example, time-of-flight pixel array 810 includes a plurality of time-of-flight pixel circuits 812A-812I. In the example, it is noted that each of the time-of-flight pixel circuits 812A-812I may be an example of the time-of-flight pixel circuit 712 described in detail in FIG. 7. Therefore, it is appreciated that each of the time-of-flight pixel circuits 812A-812I is not described again in detail in FIG. 8 for the sake of brevity.

In the example depicted in FIG. 8, the time-of-flight pixel circuits 812A-812I are arranged into rows and columns in time-of-flight pixel array 810. It is noted that time-of-flight pixel array 810 is illustrated with time-of-flight pixel circuits 812A-812I arranged into 3 rows and 3 columns for explanation purposes. In other examples, it is appreciated of course that the time-of-flight pixel array 810 may include a greater or fewer number of rows and/or a greater or fewer number of columns.

FIG. 8 depicts an example in which the reflected modulated light from the object is configured to illuminate one or more rows of time-of-flight pixel array 810, but not all of the rows of the time-of-flight pixel array 810 at a time. For instance, a first subset of the plurality of time-of-flight pixel circuits (e.g., the row including time-of-flight pixel circuits 812A-812C) is configured to be illuminated by the reflected modulated light from the object while a second subset of the plurality of time-of-flight pixel circuits (e.g., the rows including time-of-flight pixel circuits 812D-812I) is configured to be non-illuminated by the reflected modulated light from the object.

As shown in the depicted example, modulation driver block 834 includes a phase lock loop circuit 840, which is configured to generate the first and second phase modulation signals TXA and TXB. For instance, as described in the example of FIG. 7, the first and second phase modulation signals TXA and TXB are coupled to be received by the transfer transistors of time-of-flight pixel circuits 812A-812I. A light source driver 844 coupled between the light source 802 and the phase lock loop circuit 840. In operation, the light source driver circuit 844 is configured to synchronize the modulated light emitted from the light source 802 to the object with the first and second phase modulation signals TXA and TXB in response to the phase lock loop circuit 840.

Continuing with the depicted example, a plurality of driver circuits 836A-836F is coupled to the phase lock loop circuit 840. In the example, the driver circuit 836A is configured to generate the first phase modulation signal TXA and the driver circuit 536B is configured to generate the second phase modulation signal TXB for the row of time-of-flight pixel array 810 that includes time-of-flight pixels 812A-812C. The driver circuit 836C is configured to generate the first phase modulation signal TXA and the driver circuit 836D is configured to generate the second phase modulation signal TXB for the row of time-of-flight pixel array 810 that includes time-of-flight pixels 812D-812F. The driver circuit 836E is configured to generate the first phase modulation signal TXA and the driver circuit 836F is configured to generate the second phase modulation signal TXB for the row of time-of-flight pixel array 810 that includes time-of-flight pixels 812G-812I.

In the example, modulation driver block 834 also includes a plurality of driver switches 838A-838F. Each one of the plurality of driver switches 838A-838F is coupled to an output of a respective one of the plurality of driver circuits 836A-836F as shown in FIG. 8. As such, driver switch 838A is coupled to an output of driver circuit 836A, driver switch 838B is coupled to an output of driver circuit 836B, driver switch 838C is coupled to an output of driver circuit 836C, driver switch 838D is coupled to an output of driver circuit 836D, driver switch 838E is coupled to an output of driver circuit 836E, and driver switch 838F is coupled to an output of driver circuit 836F.

As shown in the example, modulation driver block 834 also includes a modulation control circuit 835 that is coupled the plurality of driver switches 838A-838F. In operation, the modulation control circuit 835 is configured to turn off or disable the driver switches that are coupled to non-illuminated time-of-flight pixel circuits while the modulation control circuit 835 is configured to turn on or enable the driver switches that are coupled to illuminated time-of-flight pixel circuits.

To illustrate, in the example above in which the first subset of the plurality of time-of-flight pixel circuits (e.g., the row including time-of-flight pixel circuits 812A-812C) is configured to be illuminated by the reflected modulated light from the object while a second subset of the plurality of time-of-flight pixel circuits (e.g., the rows including time-of-flight pixel circuits 812D-812I) is configured to be non-illuminated by the reflected modulated light from the object, the modulation control circuit 835 is configured to turn on or enable driver switches 838A and 838B and turn off or disable driver switches 836C-836F. As such, the transfer transistors of the illuminated, and therefore enabled, time-of-flight pixel circuits 812A-812C are coupled to receive and be responsive to the first and second phase modulation signals TXA and TXB, while the the transfer transistors of the non-illuminated, and therefore disabled, time-of-flight pixel circuits 812D-812F are not coupled to receive and therefore not be responsive to the first and second phase modulation signals TXA and TXB.

Continuing with the depicted example, modulation driver block 834 further includes a scan synchronize circuit 842 coupled to the modulation control circuit 835 as shown. In operation, the scan synchronize circuit 842 is configured to synchronize the scanning of the modulated light emitted by the light source across the object with the scanning of the first subset of the plurality of time-of-flight pixel circuits that are illuminated by the reflected modulated light across the time-of-flight pixel array 810. In other words, the scan synchronize circuit 842 is configured to synchronize the scanning of the modulated light emitted by the light source 802 across the object with the activation of the appropriate driver switches 838A-838F that are coupled to the corresponding time-of-flight pixel circuits 812A-812I that are illuminated by the modulated light that is reflected from the object in accordance with the teachings of the present invention.

One of the differences between the example time-of-flight light sensing system 800 of FIG. 8 and the example time-of-flight light sensing system 500A of FIG. 5A is that the time-of-flight light sensing system 800 of FIG. 8 includes a column control circuit 852 as well as a row control circuit 848. In the depicted example, column control circuit 852 is configured to generate the column reset control signal (see e.g., $CRST_{CTRL}$ in FIG. 7) coupled to control the column reset control transistor (see e.g., 738 in FIG. 7) of each of the time-of-flight pixel circuits 812A-812I. The column control circuit 852 is further configured to generate the first column sample and hold control signal (see e.g., $CSH_{CTRL}$ in FIG. 7) coupled to control the first column sample and hold control transistor (see e.g., 744A in FIG. 7) of each of the time-of-flight pixel circuits 812A-812I. The column control circuit 852 is also configured to generate the second column sample and hold control signal (see e.g., $CSH_{CTRL}$ in FIG. 7) coupled to control the second column sample and hold control transistor (see e.g., 744B in FIG. 7) of each of the time-of-flight pixel circuits 812A-812I.

Continuing with the depicted example, row control circuit 848 is configured to generate the row reset control signal (see e.g., $RRST_{CTRL}$ in FIG. 7) coupled to control the row reset control transistor (see e.g., 740 in FIG. 7) of each of the time-of-flight pixel circuits 812A-812I. In addition, row control circuit 848 is further configured to generate the row sample and hold control signal (see e.g., $RSH_{CTRL}$ in FIG. 7) coupled to control the first row sample and hold control transistor and the second row sample and hold control transistor (see e.g., 742A and 742B in FIG. 7) of each of the time-of-flight pixel circuits 812A-812I. Furthermore, the row control circuit 848 is also configured to generate a row select signal RS coupled to control the first row select transistor and the second row select transistor (see e.g., 732A and 732B in FIG. 7) of each of the time-of-flight pixel circuits 812A-812I.

In the depicted example, a column readout circuit 850 is coupled to the first bitline BL1 and the second bitline BL2 of each one of the plurality of time-of-flight pixel circuits 812A-812I to read out each one of the plurality of time-of-flight pixel circuits 812A-812I of time-of-flight pixel array 810 as shown.

In operation, it is appreciated that with the column reset control signals $CRST_{CTRL}$, the row reset control signals $RRST_{CTRL}$, the reset enable/disable control signals B2, the column sample and hold control signals $CSH_{CTRL}$, the row sample and hold signals $RSH_{CTRL}$, and the sample and hold enable/disable control signals B1 supported by time-of-flight light sensing system 800 as shown in FIG. 8, individual time-of-flight pixel circuits 812A-812I may be randomly addressed and accessed to enable spot shaped portions of time-of-flight light sensing system 800 to be illuminated and read out as shown above for example in FIG. 3F in accordance with the teachings of the present invention.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A time-of-flight sensor, comprising:
a time-of-flight pixel array including a plurality of time-of-flight pixel circuits, wherein a first subset of the plurality of time-of-flight pixel circuits is configured to be illuminated by reflected modulated light from a portion of an object while a second subset of the plurality of time-of-flight pixel circuits is configured to be non-illuminated by the reflected modulated light from the portion of the object, wherein each one of the time-of-flight pixel circuits includes:

a photodiode configured to photogenerate charge in response to the reflected modulated light incident upon the photodiode;

a first floating diffusion configured to store a first portion of charge photogenerated in the photodiode;

a first transfer transistor configured to transfer the first portion of charge from the photodiode to the first floating diffusion in response to modulation by a first phase modulation signal; and a first sample and hold transistor coupled between a first storage node and the first floating diffusion, wherein the first storage node is configured to store the first portion of charge from the first floating diffusion through the first sample and hold transistor; and a modulation driver block configured to generate the first phase modulation signal, wherein the modulation driver block is coupled to a light source that is configured to emit the modulated light to the portion of the object, wherein the modulation driver block is configured to synchronize scanning the modulated light emitted by the light source across the object with scanning of the first subset of the plurality of time-of-flight pixel circuits across the time-of-flight pixel array.

2. The time-of-flight sensor of claim 1, wherein the modulation driver block is configured to enable the time-of-flight pixel circuits included in the first subset of the plurality of time-of-flight pixel circuits to be responsive to the first phase modulation signal, wherein the modulation driver block is configured to disable the time-of-flight pixel circuits included in the second subset of the plurality of time-of-flight pixel circuits from being responsive the first phase modulation signal.

3. The time-of-flight sensor of claim 1, wherein the first subset of the plurality of time-of-flight pixel circuits includes one or more rows of time-of-flight pixel circuits of the time-of-flight pixel array.

4. The time-of-flight sensor of claim 1, wherein the first subset of the plurality of time-of-flight pixel circuits includes one or more columns of time-of-flight pixel circuits of the time-of-flight pixel array.

5. The time-of-flight sensor of claim 1, wherein the first subset of the plurality of time-of-flight pixel circuits includes a contiguous region of time-of-flight pixel circuits of the time-of-flight pixel array.

6. The time-of-flight sensor of claim 1, wherein the first subset of the plurality of time-of-flight pixel circuits includes a plurality of non-contiguous regions of time-of-flight pixel circuits of the time-of-flight pixel array.

7. The time-of-flight sensor of claim 1, wherein each one of the time-of-flight pixel circuits further includes:

a second floating diffusion configured to store a second portion of charge photogenerated in the photodiode; and a second transfer transistor configured to transfer the second portion of charge from the photodiode to the second floating diffusion in response to modulation by a second phase modulation signal generated by the modulation driver, wherein the second phase modulation signal is out of phase from the first phase modulation signal, wherein modulation driver block further configured to generate the second phase modulation signal.

8. The time-of-flight sensor of claim 7, wherein each one of the time-of-flight pixel circuits further includes:

a first reset transistor coupled between a first supply rail and the first floating diffusion, wherein the first reset transistor is configured to reset the first floating diffusion; and a second reset transistor coupled between the first supply rail and the second floating diffusion, wherein the second reset transistor is configured to reset the second floating diffusion.

9. The time-of-flight sensor of claim 8, wherein each one of the time-of-flight pixel circuits further includes:

a second sample and hold transistor coupled between a second storage node and the second floating diffusion, wherein the second storage node is configured to store the second portion of charge from the second floating diffusion through the second sample and hold transistor.

10. The time-of-flight sensor of claim 9, wherein each one of the time-of-flight pixel circuits further includes:

a first source follower transistor having a gate coupled to the first storage node;

a first row select transistor coupled between a source of the first source follower transistor and a first bitline;

a second source follower transistor having a gate coupled to the second storage node; and a second row select transistor coupled between a source of the second source follower transistor and a second bitline.

11. The time of flight sensor of claim 10, wherein the first and second storage nodes of one of the plurality of time-of-flight pixel circuits included in the second subset of the plurality of time-of-flight pixel circuits are configured to be read out at a same time that the first and second transfer transistors of one of the plurality of time-of-flight pixel circuits included in the first subset of the plurality of time-of-flight pixel circuits are configured to be modulated in response to the first and second phase modulation signals.

12. The time-of-flight sensor of claim 10, wherein each one of the time-of-flight pixel circuits further comprises:

a column reset control transistor coupled to a gate of the first reset transistor and a gate of the second reset transistor, wherein the column reset control transistor is coupled to be responsive to a column reset control signal;

a row reset control transistor coupled to the column reset control transistor, wherein the row reset control transistor is coupled to be responsive to a row reset control signal; and a reset enable/disable transistor coupled to the gate of the first reset transistor and the gate of the second reset transistor, wherein the reset enable/disable transistor is coupled to be responsive to a reset enable/disable control signal.

13. The time-of-flight sensor of claim 12, wherein each one of the time-of-flight pixel circuits further comprises:

a first column sample and hold control transistor coupled to a gate of the first sample and hold transistor, wherein the first column sample and hold control transistor is coupled to be responsive to a first column sample and hold control signal;

a first row sample and hold control transistor coupled to the first column sample and hold control transistor, wherein the first row sample and hold control transistor is coupled to be responsive to a row sample and hold control signal;

a first sample and hold enable/disable transistor coupled to the gate of the first sample and hold transistor, wherein the first sample and hold enable/disable transistor is coupled to be responsive to a sample and hold enable/disable control signal;

a second column sample and hold control transistor coupled to a gate of the second sample and hold transistor, wherein the second column sample and hold control transistor is coupled to be responsive to a second column sample and hold control signal;

a second row sample and hold control transistor coupled to the second column sample and hold control transistor, wherein the second row sample and hold control transistor is coupled to be responsive to the row sample and hold control signal; and a second sample and hold enable/disable transistor coupled to the gate of the second sample and hold transistor, wherein the second sample and hold enable/disable transistor is coupled to be responsive to the sample and hold enable/disable control signal.

14. The time-of-flight sensor of claim 10, wherein the modulation driver block comprises:
a phase lock loop circuit configured to generate the first and second phase modulation signals; and
a light source driver circuit coupled between the light source and the phase lock loop circuit, wherein the light source driver circuit is configured to synchronize the modulated light emitted from the light source to the portion of the object with the first and second phase modulation signals in response to the phase lock loop circuit.

15. The time-of-flight sensor of claim 14, wherein the modulation driver block further comprises a plurality of driver circuits coupled to the phase lock loop circuit, wherein a first one of the plurality of driver circuits is configured to generate the first phase modulation signal for the first subset of time-of-flight pixel circuits, wherein a second one of the plurality of driver circuits is configured to generate the second phase modulation signal for the first subset of time of-flight pixel circuits, wherein a third one of the plurality of driver circuits is configured to generate the first phase modulation signal for the second subset of time-of-flight pixel circuits, wherein a fourth one of the plurality of driver circuits is configured to generate the second phase modulation signal for the second subset of time-of-flight pixel circuits.

16. The time-of-flight sensor of claim 15, wherein the modulation driver block further comprises:
a plurality of driver switches, wherein each one of the plurality of driver switches is coupled to an output of a respective one of the plurality of driver circuits, wherein a first one of the plurality of driver switches is coupled to an output of the first one of the plurality of driver circuits, wherein a second one of the plurality of driver switches is coupled to an output of the second one of the plurality of driver circuits, wherein a third one of the plurality of driver switches is coupled to an output of the third one of the plurality of driver circuits, wherein a fourth one of the plurality of driver switches is coupled to an output of the fourth one of the plurality of driver circuits; and
a modulation control circuit coupled the plurality of driver switches, wherein the modulation control circuit is configured to turn off the third one of the plurality of driver switches and the fourth one of the plurality of driver switches while the modulation control circuit is configured to turn on the first one of the plurality of driver switches and the second one of the plurality of driver switches.

17. The time-of-flight sensor of claim 16, wherein the modulation driver block further comprises a scan synchronize circuit coupled to the modulation control circuit, wherein the scan synchronize circuit is configured to synchronize the scanning of the modulated light emitted by the light source across the object with the scanning of the first subset of the plurality of time-of-flight pixel circuits across the time-of-flight pixel array.

18. The time-of-flight sensor of claim 14, further comprising:
a plurality of delay lock loop circuits coupled in series to the phase lock loop circuit, wherein each of the plurality of delay cock loop circuits is configured to generate the first and second phase modulation signals with a respective phase shift; and
a plurality of logic circuits coupled to the plurality of delay lock loop circuits, wherein a first one of the plurality of logic circuits is configured to generate the first phase modulation signal for the first subset of time-of-flight pixel circuits with a first phase shift, wherein a second one of the plurality of logic circuits is configured to generate the second phase modulation signal for the first subset of time-of-flight pixel circuits with the first phase shift, wherein a third one of the plurality of logic circuits is configured to generate the first phase modulation signal for the second subset of time-of-flight pixel circuits with a second phase shift, wherein a fourth one of the plurality of logic circuits is configured to generate the second phase modulation signal for the second subset of time-of-flight pixel circuits with the second phase shift.

19. The time-of-flight sensor of claim 18, wherein the modulation driver block further comprises a modulation control circuit coupled the plurality of logic circuits, wherein the modulation control circuit is configured to disable the third one of the plurality of logic circuits and the fourth one of the plurality of logic circuits while the modulation control circuit is configured to enable the first one of the plurality of logic circuits and the second one of the plurality of logic circuits.

20. The time-of-flight sensor of claim 19, wherein the modulation driver block further comprises a scan synchronize circuit coupled to the modulation control circuit, wherein the scan synchronize circuit is configured to synchronize the scanning of the modulated light emitted by the light source across the object with the scanning of the first subset of the plurality of time-of-flight pixel circuits across the time-of-flight pixel array.

21. The time-of-flight sensor of claim 10, wherein the time-of-flight sensor further comprises:
a row control circuit configured to generate a reset signal coupled to control the first reset transistor and the second reset transistor,
wherein the row control circuit is further configured to generate a sample and hold signal coupled to control the first sample and hold transistor and the second sample and hold transistor,
wherein the row control circuit is further configured to generate a row select signal coupled to control the first row select transistor and the second row select transistor; and
a column readout circuit coupled to the first bitline and the second bitline to read out each one of the time-of-flight pixel circuits.

22. The time-of-flight sensor of claim 13,
a column control circuit configured to generate the column reset control signal coupled to control the column reset control transistor,
wherein the column control circuit is further configured to generate the first column sample and hold control signal coupled to control the first column sample and hold control transistor,
wherein the column control circuit is further configured to generate the second column sample and hold control signal coupled to control the second column sample and hold control transistor;
a row control circuit configured to generate the row reset control signal coupled to control the row reset control transistor,
wherein the row control circuit is further configured to generate the row sample and hold control signal coupled to control the first row sample and hold control transistor and the second row sample and hold control transistor,
wherein the row control circuit is further configured to generate a row select signal coupled to control the first row select transistor and the second row select transistor; and
a column readout circuit coupled to the first bitline and the second bitline to read out each one of the time-of-flight pixel circuits.

23. A time-of-flight sensing system, comprising:
a light source configured to emit modulated light to a portion of an object; and
a time-of-flight sensor configured to sense reflected modulated light from the object, wherein the time-of-flight sensor includes:
  a time-of-flight pixel array including a plurality of time-of-flight pixel circuits, wherein a first subset of the plurality of time-of-flight pixel circuits is configured to be illuminated by the reflected modulated light from the object while a second subset of the plurality of time-of-flight pixel circuits is configured to be non-illuminated by the reflected modulated light from the object, wherein each one of the time-of-flight pixel circuits includes:
    a photodiode configured to photogenerate charge in response to the reflected modulated light incident upon the photodiode;
    a first floating diffusion configured to store a first portion of charge photogenerated in the photodiode;
    a first transfer transistor configured to transfer the first portion of charge from the photodiode to the first floating diffusion in response to modulation by a first phase modulation signal; and
    a first sample and hold transistor coupled between a first storage node and the first floating diffusion, wherein the first storage node is configured to store the first portion of charge from the first floating diffusion through the first sample and hold transistor; and
  a modulation driver block configured to generate the first phase modulation signal, wherein the modulation driver block is configured to synchronize scanning of the modulated light across the object with scanning of the first subset of the plurality of time-of-flight pixel circuits across the time-of-flight pixel array that are configured to be illuminated by the reflected modulated light from the portion of the object.

24. The time-of-flight sensing system of claim 23, wherein the modulation driver block is configured to enable the time-of-flight pixel circuits included in the first subset of the plurality of time-of-flight pixel circuits to be responsive to the first phase modulation signal, wherein the modulation driver block is configured to disable the time-of-flight pixel circuits included in the second subset of the plurality of time-of-flight pixel circuits from being responsive the first phase modulation signal.

25. The time-of-flight sensing system of claim 23, wherein the first subset of the plurality of time-of-flight pixel circuits includes one or more rows of time-of-flight pixel circuits of the time-of-flight pixel array.

26. The time-of-flight sensing system of claim 23, wherein the first subset of the plurality of time-of-flight pixel circuits includes one or more columns of time-of-flight pixel circuits of the time-of-flight pixel array.

27. The time-of-flight sensing system of claim 23, wherein the first subset of the plurality of time-of-flight pixel circuits includes a contiguous region of time-of-flight pixel circuits of the time-of-flight pixel array.

28. The time-of-flight sensing system of claim 23, wherein the first subset of the plurality of time-of-flight pixel circuits includes a plurality of non-contiguous regions of time-of-flight pixel circuits of the time-of-flight pixel array.

29. The time-of-flight sensing system of claim 23, wherein each one of the time-of-flight pixel circuits further includes:
  a second floating diffusion configured to store a second portion of charge photogenerated in the photodiode; and
  a second transfer transistor configured to transfer the second portion of charge from the photodiode to the second floating diffusion in response to modulation by a second phase modulation signal generated by the modulation driver, wherein the second phase modulation signal is out of phase from the first phase modulation signal, wherein modulation driver block further configured to generate the second phase modulation signal.

30. The time-of-flight sensing system of claim 29, wherein each one of the time-of-flight pixel circuits further includes:
  a first reset transistor coupled between a first supply rail and the first floating diffusion, wherein the first reset transistor is configured to reset the first floating diffusion; and
  a second reset transistor coupled between the first supply rail and the second floating diffusion, wherein the second reset transistor is configured to reset the second floating diffusion.

31. The time-of-flight sensing system of claim 30, wherein each one of the time-of-flight pixel circuits further includes:
  a second sample and hold transistor coupled between a second storage node and the second floating diffusion, wherein the second storage node is configured to store the second portion of charge from the second floating diffusion through the second sample and hold transistor.

32. The time-of-flight sensing system of claim 31, wherein each one of the time-of-flight pixel circuits further includes:
  a first source follower transistor having a gate coupled to the first storage node;
  a first row select transistor coupled between a source of the first source follower transistor and a first bitline;

a second source follower transistor having a gate coupled to the second storage node; and a second row select transistor coupled between a source of the second source follower transistor and a second bitline.

33. The time-of-flight sensing system of claim 32, wherein the first and second storage nodes of one of the plurality of time-of-flight pixel circuits included in the second subset of the plurality of time-of-flight pixel circuits are configured to be read out at a same time that the first and second transfer transistors of one of the plurality of time-of-flight pixel circuits included in the first subset of the plurality of time-of-flight pixel circuits are configured to be modulated in response to the first and second phase modulation signals.

34. The time-of-flight sensing system of claim 32, wherein each one of the time-of-flight pixel circuits further comprises:

a column reset control transistor coupled to a gate of the first reset transistor and a gate of the second reset transistor, wherein the column reset control transistor is coupled to be responsive to a column reset control signal;

a row reset control transistor coupled to the column reset control transistor, wherein the row reset control transistor is coupled to be responsive to a row reset control signal; and a reset enable/disable transistor coupled to the gate of the first reset transistor and the gate of the second reset transistor, wherein the reset enable/disable transistor is coupled to be responsive to a reset enable/disable control signal.

35. The time-of-flight sensing system of claim 34, wherein each one of the time-of-flight pixel circuits further comprises:

a first column sample and hold control transistor coupled to a gate of the first sample and hold transistor, wherein the first column sample and hold control transistor is coupled to be responsive to a first column sample and hold control signal;

a first row sample and hold control transistor coupled to the first column sample and hold control transistor, wherein the first row sample and hold control transistor is coupled to be responsive to a row sample and hold control signal;

a first sample and hold enable/disable transistor coupled to the gate of the first sample and hold transistor, wherein the first sample and hold enable/disable transistor is coupled to be responsive to a sample and hold enable/disable control signal;

a second column sample and hold control transistor coupled to a gate of the second sample and hold transistor, wherein the second column sample and hold control transistor is coupled to be responsive to a second column sample and hold control signal;

a second row sample and hold control transistor coupled to the second column sample and hold control transistor, wherein the second row sample and hold control transistor is coupled to be responsive to the row sample and hold control signal; and a second sample and hold enable/disable transistor coupled to the gate of the second sample and hold transistor, wherein the second sample and hold enable/disable transistor is coupled to be responsive to the sample and hold enable/disable control signal.

36. The time-of-flight sensing system of claim 32, wherein the modulation driver block comprises:

a phase lock loop circuit configured to generate the first and second phase modulation signals; and a light source driver circuit coupled between the light source and the phase lock loop circuit, wherein the light source driver circuit is configured to synchronize the modulated light emitted from the light source to the portion of the object with the first and second phase modulation signals in response to the phase lock loop circuit.

37. The time-of-flight sensing system of claim 36, wherein the modulation driver block further comprises a plurality of driver circuits coupled to the phase lock loop circuit, wherein a first one of the plurality of driver circuits is configured to generate the first phase modulation signal for the first subset of time-of-flight pixel circuits, wherein a second one of the plurality of driver circuits is configured to generate the second phase modulation signal for the first subset of time-of-flight pixel circuits, wherein a third one of the plurality of driver circuits is configured to generate the first phase modulation signal for the second subset of time-of-flight pixel circuits, wherein a fourth one of the plurality of driver circuits is configured to generate the second phase modulation signal for the second subset of time-of-flight pixel circuits.

38. The time-of-flight sensing system of claim 37, wherein the modulation driver block further comprises:

a plurality of driver switches, wherein each one of the plurality of driver switches is coupled to an output of a respective one of the plurality of driver circuits, wherein a first one of the plurality of driver switches is coupled to an output of the first one of the plurality of driver circuits, wherein a second one of the plurality of driver switches is coupled to an output of the second one of the plurality of driver circuits, wherein a third one of the plurality of driver switches is coupled to an output of the third one of the plurality of driver circuits, wherein a fourth one of the plurality of driver switches is coupled to an output of the fourth one of the plurality of driver circuits; and a modulation control circuit coupled the plurality of driver switches, wherein the modulation control circuit is configured to turn off the third one of the plurality of driver switches and the fourth one of the plurality of driver switches while the modulation control circuit is configured to turn on the first one of the plurality of driver switches and the second one of the plurality of driver switches.

39. The time-of-flight sensing system of claim 38, wherein the modulation driver block further comprises a scan synchronize circuit coupled to the modulation control circuit, wherein the scan synchronize circuit is configured to synchronize the scanning of the modulated light emitted by the light source across the object with the scanning of the first subset of the plurality of time-of-flight pixel circuits across the time-of-flight pixel array.

40. The time time-of-flight sensing system of claim 36, wherein the modulation driver block comprises:

a plurality of delay lock loop circuits coupled in series to the phase lock loop circuit, wherein each of the plurality of delay cock loop circuits is configured to generate the first and second phase modulation signals with a respective phase shift; and a plurality of logic circuits coupled to the plurality of delay lock loop circuits, wherein a first one of the plurality of logic circuits is configured to generate the first phase modulation signal for the first subset of time-of-flight pixel circuits with a first phase shift, wherein a second one of the plurality of logic circuits is configured to generate the second phase modulation signal for the first subset of time-of-flight pixel circuits with the first phase shift, wherein a third one of the plurality of logic circuits is configured to generate the first phase modulation signal for the second subset of time-of-flight pixel circuits with a second phase shift, wherein a fourth one of the plurality of logic circuits is configured to generate the second phase modulation signal for the second subset of time-of-flight pixel circuits with the second phase shift.

41. The time-of-flight sensing system of claim 40, wherein the modulation driver block further comprises a modulation control circuit coupled the plurality of logic circuits, wherein the modulation control circuit is configured to disable the third one of the plurality of logic circuits and the fourth one of the plurality of logic circuits while the modulation control circuit is configured to enable the first one of the plurality of logic circuits and the second one of the plurality of logic circuits.

42. The time-of-flight sensing system of claim 41, wherein the modulation driver block further comprises a scan synchronize circuit coupled to the modulation control circuit, wherein the scan synchronize circuit is configured to synchronize the scanning of the modulated light emitted by the light source across the object with the scanning of the first subset of the plurality of time-of-flight pixel circuits across the time-of-flight pixel array.

43. The time-of-flight sensing system of claim 32, wherein the time-of-flight sensor further comprises:
   a row control circuit configured to generate a reset signal coupled to control the first reset transistor and the second reset transistor,
   wherein the row control circuit is further configured to generate a sample and hold signal coupled to control the first sample and hold transistor and the second sample and hold transistor,
   wherein the row control circuit is further configured to generate a row select signal coupled to control the first row select transistor and the second row select transistor; and
   a column readout circuit coupled to the first bitline and the second bitline to read out each one of the time-of-flight pixel circuits.

44. The time-of-flight sensing system of claim 43,
   a column control circuit configured to generate the column reset control signal coupled to control the column reset control transistor,
   wherein the column control circuit is further configured to generate the first column sample and hold control signal coupled to control the first column sample and hold control transistor,
   wherein the column control circuit is further configured to generate the second column sample and hold control signal coupled to control the second column sample and hold control transistor;
   a row control circuit configured to generate the row reset control signal coupled to control the row reset control transistor,
   wherein the row control circuit is further configured to generate the row sample and hold control signal coupled to control the first row sample and hold control transistor and the second row sample and hold control transistor,
   wherein the row control circuit is further configured to generate a row select signal coupled to control the first row select transistor and the second row select transistor; and
   a column readout circuit coupled to the first bitline and the second bitline to read out each one of the time-of-flight pixel circuits.

* * * * *